(12) United States Patent
Park et al.

(10) Patent No.: US 9,282,264 B2
(45) Date of Patent: Mar. 8, 2016

(54) ANALOG-TO-DIGITAL CONVERSION CIRCUIT, AND IMAGE SENSOR INCLUDING THE SAME

(71) Applicants: Yu Jin Park, Seoul (KR); Han Yang, Yongin-si (KR); Sin-Hwan Lim, Hwaseong-si (KR); Kyo Jin Choo, Seoul (KR); Seog Heon Ham, Suwon-si (KR)

(72) Inventors: Yu Jin Park, Seoul (KR); Han Yang, Yongin-si (KR); Sin-Hwan Lim, Hwaseong-si (KR); Kyo Jin Choo, Seoul (KR); Seog Heon Ham, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/303,221

(22) Filed: Jun. 12, 2014

(65) Prior Publication Data

US 2014/0293106 A1    Oct. 2, 2014

Related U.S. Application Data

(63) Continuation of application No. 13/669,983, filed on Nov. 6, 2012, now Pat. No. 8,773,191.

(30) Foreign Application Priority Data

Sep. 7, 2012 (KR) .......... 10-2012-0099452

(51) Int. Cl.
| | |
|---|---|
| H04N 5/359 | (2011.01) |
| H03K 5/08 | (2006.01) |
| H03M 1/08 | (2006.01) |
| H04N 5/365 | (2011.01) |
| H04N 5/335 | (2011.01) |
| H04N 5/363 | (2011.01) |
| H04N 5/374 | (2011.01) |
| H03M 1/12 | (2006.01) |
| H03M 1/56 | (2006.01) |

(52) U.S. Cl.
CPC ............ *H04N 5/3658* (2013.01); *H03K 5/08* (2013.01); *H03M 1/08* (2013.01); *H03M 1/12* (2013.01); *H04N 5/3355* (2013.01); *H04N 5/3591* (2013.01); *H04N 5/363* (2013.01); *H04N 5/3742* (2013.01); *H03M 1/123* (2013.01); *H03M 1/56* (2013.01)

(58) Field of Classification Search
CPC ............ H03K 5/24; H03K 5/08; H03M 1/12; H03M 1/56
See application file for complete search history.

(56) References Cited

U.S. PATENT DOCUMENTS

| | | | |
|---|---|---|---|
| 5,032,744 A | 7/1991 | Wai Yeung Liu | |
| 5,245,223 A * | 9/1993 | Lim et al. | ........ 327/80 |
| 5,898,323 A | 4/1999 | Suda | |
| 6,529,237 B1 | 3/2003 | Tsay et al. | |
| 7,301,487 B2 | 11/2007 | Funakoshi et al. | |
| 7,477,299 B2 | 1/2009 | Higuchi et al. | |
| 7,554,378 B2 | 6/2009 | Walker | |
| 8,749,424 B2 * | 6/2014 | Ueno | ........ 341/169 |
| 2004/0179118 A1 | 9/2004 | Itani | |
| 2006/0012405 A1 | 1/2006 | Martins | |
| 2008/0067327 A1 | 3/2008 | Koseki | |
| 2010/0157035 A1 | 6/2010 | Purcell et al. | |
| 2010/0309356 A1 | 12/2010 | Ihara et al. | |

* cited by examiner

*Primary Examiner* — Howard Williams
(74) *Attorney, Agent, or Firm* — Harness, Dickey & Pierce, P.L.C.

(57) ABSTRACT

One embodiment of an analog-to-digital converter includes at least one comparator and a restriction circuit. The comparator has first and second input nodes and a connection node. The connection node is one of an internal node and an output node of the comparator. The restriction circuit is electrically connected to the connection node, and the restriction circuit is configured to restrict a voltage of the connection node.

18 Claims, 30 Drawing Sheets

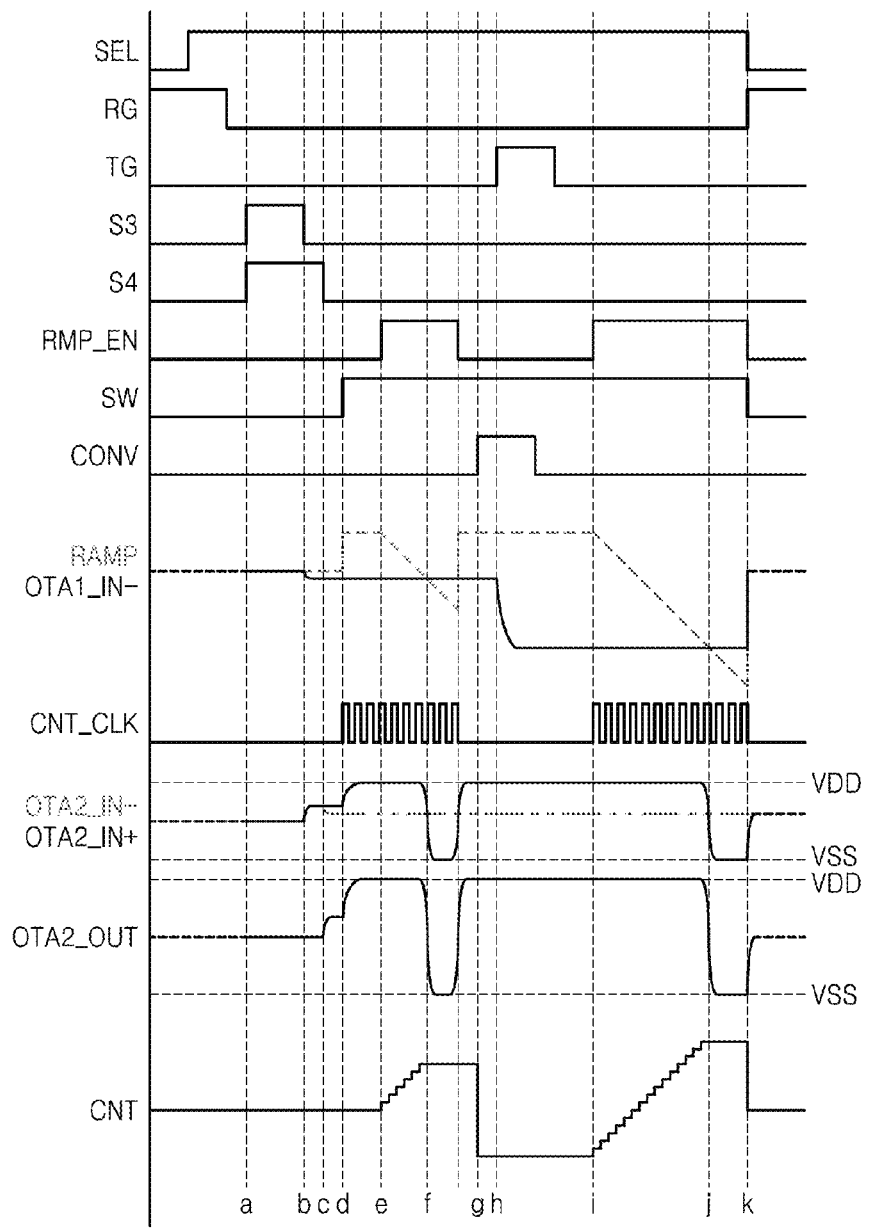

ANALOG-TO-DIGITAL CONVERSION CIRCUIT, AND IMAGE SENSOR INCLUDING THE SAME

CROSS-REFERENCE TO RELATED APPLICATIONS

This application is a continuation application of U.S. application Ser. No. 13/669,983, filed Nov. 6, 2012, which claims priority under 35 U.S.C. §119(a) from Korean Patent Application No. 10-2012-0099452 filed on Sep. 7, 2012, the disclosure of each of which is hereby incorporated by reference in its entirety.

BACKGROUND

Embodiments of the inventive concepts relate to an image sensor, and more particularly, to an analog-to-digital conversion circuit for an image sensor and an image sensor including the same.

An image sensor is a device that captures the two-dimensional or three-dimensional image of an object. The image sensor generates the image of an object using a photoelectric conversion element, which reacts to the intensity of light reflected from the object. Recently, with the development of complementary metal-oxide semiconductor (CMOS) technology, CMOS image sensors using CMOS technology have been spread widely.

Correlated double sampling (CDS) techniques are normally used in CMOS image sensors to efficiently eliminate pixel reset noise. However, problems of row-wise banding noise caused by ground fluctuation and sunspots occurring by amplifying the abnormal signal of a pixel in an analog-to-digital conversion circuit using a CDS technique are yet to be solved.

SUMMARY

Some example embodiments relate to an analog-to-digital converter.

Some example embodiments relate to an analog-to-digital converter for an image sensor, where the analog-to-digital converter converts analog pixels signals to digital.

Some example embodiments relate to an image sensor including at least one analog-to-digital converter of an example embodiment.

Some example embodiments relate to electronic devices including an image sensor according to an example embodiment.

One embodiment of an analog-to-digital converter includes at least one comparator and a restriction circuit. The comparator has first and second input nodes and a connection node. The connection node is one of an internal node and an output node of the comparator. The restriction circuit is electrically connected to the connection node, and the restriction circuit is configured to restrict a voltage of the connection node.

In one embodiment, the comparator includes an amplifier, and the connection node is one of an internal node and an output node of the amplifier.

In one embodiment, the restriction circuit includes a diode. The diode may be connected to ground or to a power supply voltage.

In one embodiment, the restriction circuit includes a switch connected in series to the diode. The switch may be configured to disable the restriction circuit during an initial operation period of the comparator.

In one embodiment, the comparator includes an amplifier having first and second output nodes, at least one of the first and second output nodes of the amplifier serving as the output node of the comparator, and the restriction circuit being electrically connected between the first and second output nodes of the amplifier. In this embodiment, the restriction circuit may include a diode. For example, the restriction circuit may be a diode connected PMOS transistor.

In one embodiment, the analog-to-digital converter further includes a counter configured to generate a count value based on output from the comparator.

In one embodiment, the comparator is configured to compare first and second inputs. The first input is a pixel signal, and the second input is a ramp signal.

In another embodiment, the analog-to-digital converter includes at least one comparator and a restriction circuit. The comparator has an output node. The restriction circuit is electrically connected to the output node. The restriction circuit is configured to suppress a change in total current if the comparator output changes, and the total current is a current flowing through the comparator plus a current flowing through the restriction circuit.

In a further embodiment, the analog-to-digital converter includes at least one comparing circuit. The comparing circuit includes a first comparator, a second comparator connected to an output of the first comparator, and a first restriction circuit electrically connected to the output of the first comparator. The restriction circuit is configured to restrict a voltage at the output of the first comparator.

In one embodiment, the first restriction circuit includes a diode. The diode may be connected to ground or to a power supply voltage.

In one embodiment, the first restriction circuit includes a switch connected in series to the diode. The switch may be configured to disable the restriction circuit during an initial operation period of the comparator.

In one variation of this further, the comparing circuit includes a second restriction circuit. The second restriction circuit is electrically connected to an output of the second comparator, and the second restriction circuit is configured to restrict a voltage at the output of the second comparator.

In one embodiment, the first comparator includes an amplifier having first and second output nodes, and at least one of the first and second output nodes of the amplifier serves as the output of the first comparator. Also, the comparing circuit includes a third restriction circuit. The third restriction circuit is electrically connected between the first and second output nodes of the amplifier, and the third restriction circuit configured to restrict a voltage at the output of the first comparator.

In another variation of this further embodiment, the first comparator includes an amplifier having first and second output nodes, and at least one of the first and second output nodes of the amplifier serves as the output of the first comparator. Also, the comparing circuit includes a second restriction circuit. The second restriction circuit is electrically connected between the first and second output nodes of the amplifier, and the second restriction circuit configured to restrict a voltage at the output of the first comparator.

In an additional embodiment, the analog-to-digital converter includes at least one comparing circuit. The comparing circuit includes a first comparator, a second comparator connected to an output of the first comparator, and a first restriction circuit electrically connected to the output of the second comparator, the restriction circuit configured to restrict a voltage at the output of the second comparator.

In one embodiment, the restriction circuit includes a diode.

In one embodiment, the restriction circuit includes a switch connected in series to the diode. The switch may be configured to disable the restriction circuit during an initial operation period of the comparator.

In a variation of this additional embodiment, the first comparator includes an amplifier having first and second output nodes, and at least one of the first and second output nodes of the amplifier serves as the output of the first comparator. Also, the comparing circuit includes a second restriction circuit. The second restriction circuit is electrically connected between the first and second output nodes of the amplifier, and the second restriction circuit configured to restrict a voltage at the output of the first comparator.

In yet another embodiment, the analog-to-digital converter includes at least one comparing circuit. The comparing circuit includes a first comparator The first comparator includes an amplifier having first and second output nodes, and at least one of the first and second output nodes of the amplifier serves as an output node of the first comparator. The comparing circuit further includes a second comparator connected to the output node of the first comparator, and a restriction circuit electrically connected between the first and second output nodes of the amplifier. The restriction circuit is configured to restrict a voltage at the output node of the first comparator.

In a still further embodiment, the analog-to-digital converter includes a first comparator. The first comparator includes an amplifier. The amplifier includes a first output node between a first PMOS transistor and a first NMOS transistor. The first PMOS transistor and the first NMOS transistor are connected in series between a power supply voltage and a common node. The amplifier further includes a second output node between a second PMOS transistor and a second NMOS transistor. The second PMOS transistor and the second NMOS transistor are connected in series between the power supply voltage and the common node. A transistor is connected between the first and second output nodes, and a gate of the transistor connected to the second output node. The transistor may be a PMOS transistor.

In another embodiment, the analog-to-digital converter includes a first comparator. The first comparator includes an amplifier. The amplifier includes a first output node between a first PMOS transistor and a first NMOS transistor. The first PMOS transistor and the first NMOS transistor are connected in series between a power supply voltage and a common node. The amplifier further includes a second output node between a second PMOS transistor and a second NMOS transistor. The second PMOS transistor and the second NMOS transistor are connected in series between the power supply voltage and the common node. A restriction circuit is connected between the first and second output nodes. The restriction circuit is configured to suppress a change in current flowing through the amplifier when a voltage at the common node falls below a saturation voltage of the first and second NMOS transistors.

In one embodiment of an image sensor, the image sensor includes a pixel array configured to generate at least one pixel signal, a ramp generator configured to generate a ramp signal, and an analog-to-digital converter. The analog-to-digital converter is configured to receive the ramp signal and the pixel signal, and is configured to generate a digital signal representing the pixel signal. The analog-to-digital converter includes at least one comparator, a restriction circuit and a counter. The comparator has first and second input nodes and a connection node, and the connection node is one of an internal node and an output node of the comparator. The restriction circuit is electrically connected to the connection node, the restriction circuit configured to restrict a voltage of the connection node. The counter is configured to generate a count value based on output from the comparator.

BRIEF DESCRIPTION OF THE DRAWINGS

The above and other features and advantages of the inventive concepts will become more apparent by describing in detail exemplary embodiments thereof with reference to the attached drawings in which:

FIG. 15 is a schematic signal timing chart of the column comparator circuit illustrated in FIG. 12;

DETAILED DESCRIPTION OF THE EMBODIMENTS

Figure 1:
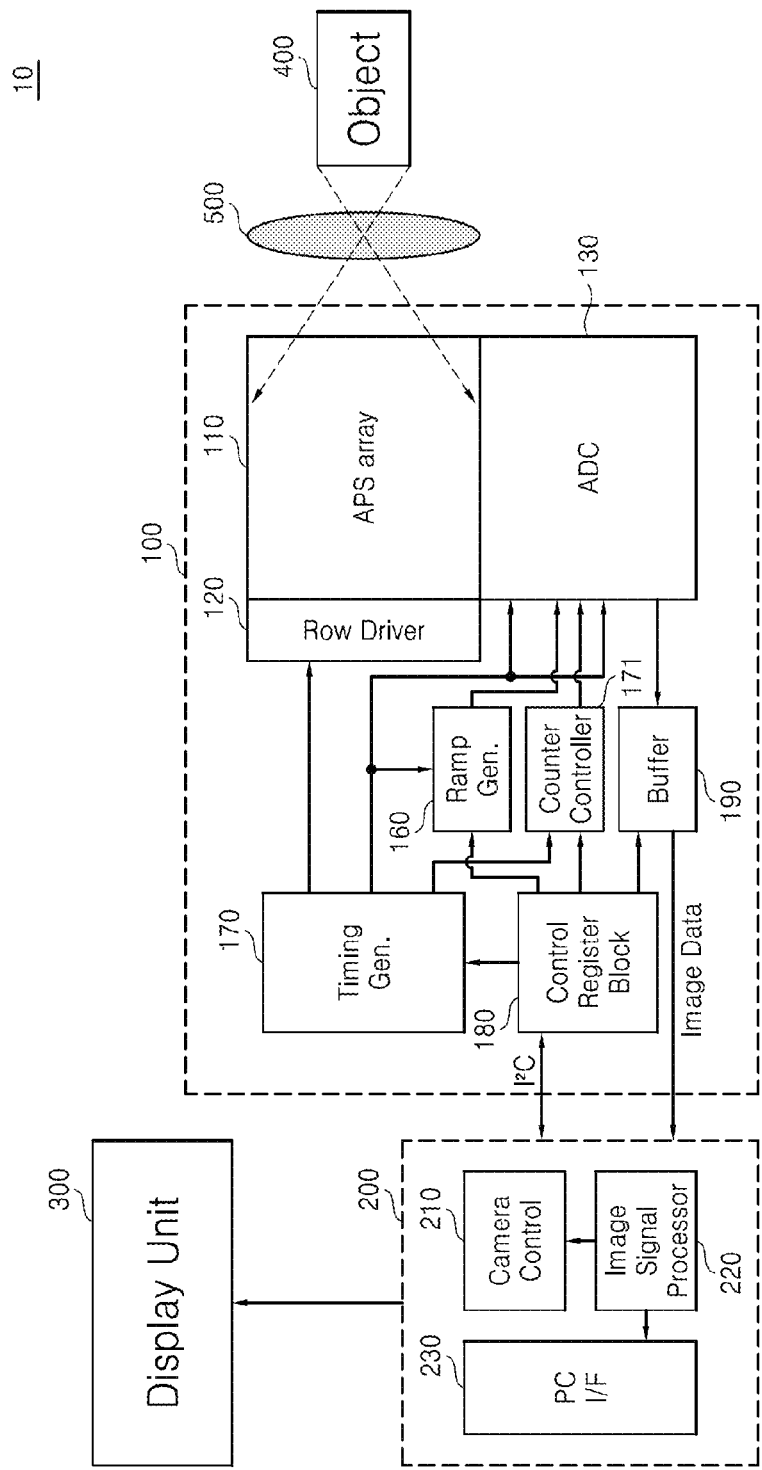
FIG. 1 is a schematic block diagram for explaining an image processing system according to some embodiments of the inventive concepts.

The inventive concepts now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a schematic block diagram for explaining an image processing system 10 according to some embodiments of the inventive concepts. The image processing system 10 may include an image sensor 100, an image processor (or a digital signal processor (DSP)) 200, a display unit 300, and a lens 500. The image sensor 100 includes a pixel array (e.g., an active pixel sensor (APS) array) 110, a row driver 120, an analog-to-digital converter (ADC) 130, a ramp generator 160, a timing generator 170, a counter controller 171, a control register block 180, and a buffer 190.

The image sensor 100 is controlled by the DSP 200 to sense an object 400 captured through the lens 500. The DSP 200 may output an image, which has been sensed and output by the image sensor 100, to the display unit 300. The display unit 300 may be any device that can output an image. For instance, the display unit 300 may be a computer, a mobile phone, or any type of image display terminal.

The DSP 200 includes a camera control 210, an image signal processor 220, and a personal computer (PC) interface (I/F) 230. The camera control 210 controls the control register block 180. The camera control 210 may control the image sensor 100, and more specifically, the control register block 180 using an inter-integrated circuit (I2C) interface protocol, but the scope of the inventive concepts are not restricted thereto.

The image signal processor 220 receives image data, i.e., an output signal of the buffer 190, processes the image data into an image for people to look at, and outputs the image to the display unit 300 through PC I/F 230.

The image signal processor 220 is positioned within the DSP 200 in FIG. 1, but the design may be changed by those skilled in the art. For instance, the image signal processor 220 may be positioned within the image sensor 100.

The pixel array 110 includes a plurality of photo sensitive devices such as photo diodes or pinned photo diodes. The pixel array 110 senses light using the photo sensitive devices and converts the light into electrical signals to generate an image signal.

The timing generator 170 may output a control signal or a clock signal to the row driver 120, the ADC 130, the ramp generator 160, and the counter controller 171 to control the operations or the timing of the row driver 120, the ADC 130, the ramp generator 160, and the counter controller 171. The control register block 180 may output a control signal to the ramp generator 160, the timing generator 170, the counter controller 171, and the buffer 190 to control the operations of the elements 160, 170, 171, and 190. The control register block 180 is controlled by the camera control 210.

The counter controller 171 may receive a control signal from the control register block 180 and transmit a counter control signal to a plurality of counters (151 in FIG. 2) included in the ADC 130 to control the operations of the counters 151. The counter control signal may include a counter reset signal for controlling the reset operation of the counters 151 and an inverting signal (CONV in FIG. 15) for inverting all internal bits of the counters 151. The counter controller 171 may receive a clock signal from the timing generator 170 and provide a counter clock signal (CNT_CLK in FIG. 15) to the counters 151.

Figure 2:
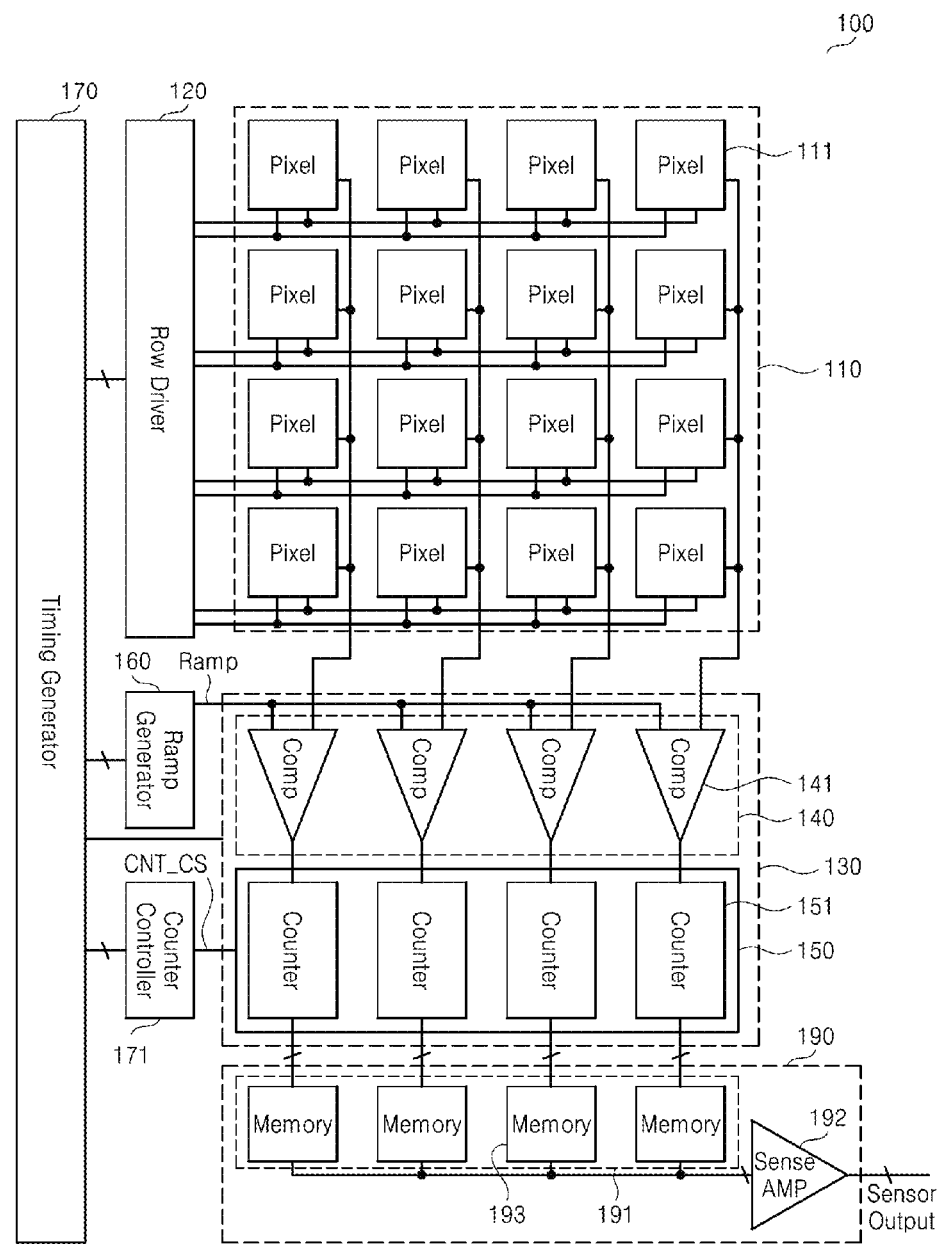
FIG. 2 is a detailed diagram of an image sensor according to some embodiments of the inventive concepts.

FIG. 2 is a detailed diagram of the image sensor 100 according to some embodiments of the inventive concepts. Referring to FIG. 2, the row driver 120 drives the pixel array 110 in units of rows. For instance, the row driver 120 may generate a row selection signal. The pixel array 110 outputs a pixel signal from a row selected by the row selection signal received from the row driver 120. The pixel signal may include a reset signal and an image signal.

The ADC 130 converts an analog pixel signal received from the pixel array 110 into a digital signal using a ramp signal from the ramp generator 160. The ADC 130 may include a comparison block 140 and an analog-to-digital conversion block 150.

A readout circuit (not shown) may also be provided between the pixel array 110 and the ADC 130 to transmit a pixel signal from the pixel array 110 to the ADC 130.

The buffer 190 temporarily stores a digital signal output from the ADC 130 and senses and amplifies the digital signal before outputting it. The buffer 190 may include a plurality of column memory blocks, e.g., static random access memories (SRAMs), provided for respective columns for temporal storing; and a sense amplifier sensing and amplifying the digital signal received from the ADC 130.

The pixel array 110 includes a plurality of pixels 111 arranged in a matrix form, each of which is connected to one of a plurality of row lines and one of a plurality of column lines.

The pixels 111 may include a red pixel which converts light in the red spectrum into an electrical signal, a green pixel which converts light in the green spectrum into an electrical signal, and a blue pixel which converts light in the blue spectrum into an electrical signal. In addition, a color filter may be arrayed above each of the pixels 111 to transmit light in a particular spectrum.

The row driver 120 may decode a row control signal (e.g., an address signal) generated by the timing generator 170 and select at least one row line from among the row lines included in the pixel array 110 in response to a decoded row control signal.

The comparison block 140 compares a pixel signal output from a pixel connected to each of the column lines in the pixel array 110 with the ramp signal Ramp. The comparison block 140 includes a plurality of column comparator circuits 141 corresponding to the respective columns. The column comparator circuits 141 are connected to the pixel array 110 and the ramp generator 160.

The column comparator circuits 141 may compare a pixel signal with a ramp signal Ramp received from the ramp generator 160 and output a comparison result signal to an output terminal. The comparison result signal output from the column comparator circuits 141 may correspond to a difference between an image signal varying with the luminance of external light and a reset signal. To output the difference between the image signal and the reset signal, the ramp signal Ramp is used, so that the difference between the image signal and the reset signal is picked up and output according to the slope of the ramp signal Ramp. The ramp generator 160 may operate based on a control signal generated by the timing generator 170.

The analog-to-digital conversion block 150 includes a plurality of the counters 151. The counters 151 are respectively connected to output terminals of the respective column comparator circuits 141 and count based on output from the respective column comparator circuit 141. The counter controller 171 may generate and transmit a counter control signal CNT_CS to the analog-to-digital conversion block 150. The counter control signal CNT_CS may include the counter clock signal CNT_CLK, a counter reset signal for controlling the reset operation of the counters 151, a counter setting signal for changing a particular internal bit of the counters 151, and the inverting signal CONV for inverting all internal bits of the counters 151. The analog-to-digital conversion block 150 counts the comparison result signal according to the counter clock signal CNT_CLK received from the counter controller 171 and outputs a digital signal corresponding to a count result.

The counter controller 171 is positioned outside the timing generator 170 in FIGS. 1 and 2, but the inventive concepts are not restricted to those embodiments. The counter controller 171 may be positioned within the analog-to-digital conversion block 150 or the timing generator 170.

The counters 151 may be up/down counters or bit-wise inversion counters. The bit-wise inversion counter may carry out a similar operation to the up/down counter. For instance, the bit-wise inversion counter may have a function of performing only up-counting and a function of inverting all bits therewithin to make them into 1's complements. Therefore, the bit-wise inversion counter may perform reset counting and invert a result of the reset counting, so that the result is converted into 1's complement, i.e., a negative value.

Each of the counters 151 may change a particular internal bit therewithin according to a counter setting signal output from the counter controller 171. At this time, the counter controller 171 may include a switch (not shown) to provide the counter setting signal to only some of the counters 151. Alternatively, the switch may be positioned within the counters 151.

The buffer 190 includes a column memory block 191 and a sense amplifier 192. The column memory block 191 includes a plurality of memories 193.

Each memory 193 may operate in response to a memory control signal generated by a memory controller (not shown) positioned within the column memory block 191 or the timing generator 170 based on a control signal generated by the timing generator 170. The memory 193 may be an SRAM.

In response to the memory control signal, the column memory block 191 temporarily stores a digital signal output from each of the counters 151 and then outputs it to the sense amplifier 192. The sense amplifier 192 senses and amplifies the digital signal before outputting it.

FIGS. 3A through 3E are circuit diagrams of examples of a pixel 111 included in the pixel array 110 of the image sensor 100 illustrated in FIG. 2.

Figure 3A:
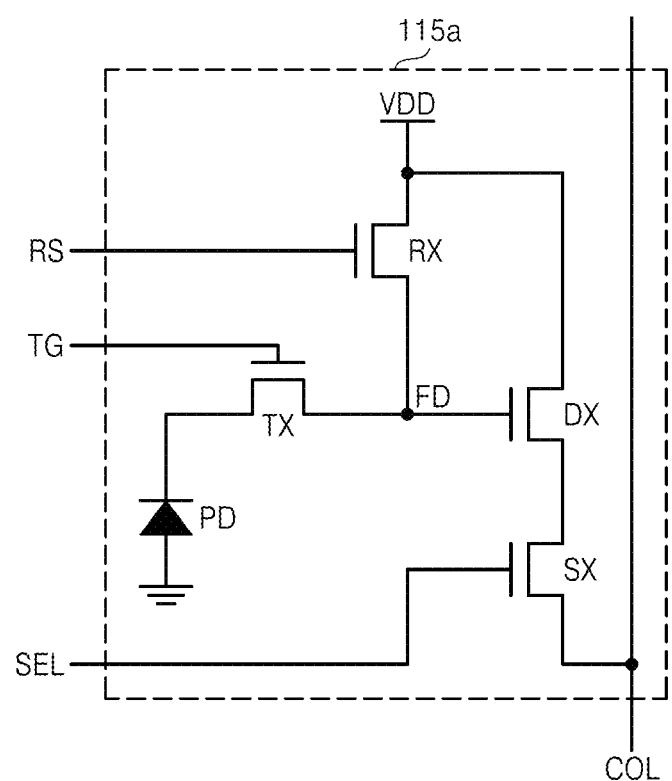
FIGS. 3A through 3E are circuit diagrams of examples of a pixel included in a pixel array of the image sensor illustrated in FIG. 2.

Referring to FIG. 3A, a unit pixel 115a may include a photodiode PD, a transfer transistor TX, a floating diffusion node FD, a reset transistor RX, a drive transistor DX, and a select transistor SX.

The photodiode PD is an example of a photoelectric conversion element. It may include at least one among a photo transistor, a photo gate, a pinned photodiode (PPD), and a combination thereof.

FIG. 3A shows a 4-transistor (4T) structure that includes a single photodiode PD and four metal oxide semiconductor (MOS) transistors TX, RX, DX, and SX, but the inventive concepts are not restricted to this example. Any circuits including at least three transistors (including the drive transistor DX and the select transistor SX) and the photodiode PD may be used in the embodiments of the inventive concepts.

In the operation of the unit pixel 115a, the photodiode PD generates photocharge varying with the intensity of light reflected from the object 400. The transfer transistor TX may transfer the photocharge to the floating diffusion node FD in response to a transfer control signal TG received from the row driver 120.

The drive transistor DX may transmit the photocharge to the select transistor SX according to the potential of the photocharge accumulated at the floating diffusion node FD.

The select transistor SX has a drain node connected to a source node of the drive transistor DX. The select transistor SX may output a pixel signal to a column line connected to the unit pixel 115a in response to a select signal SEL received from the row drive 120.

The reset transistor RX may reset the floating diffusion node FD to a power supply voltage VDD in response to a reset signal RS received from the row driver 120.

Other examples of the pixel 111 are illustrated in FIGS. 3B through 3E.

Figure 3B:
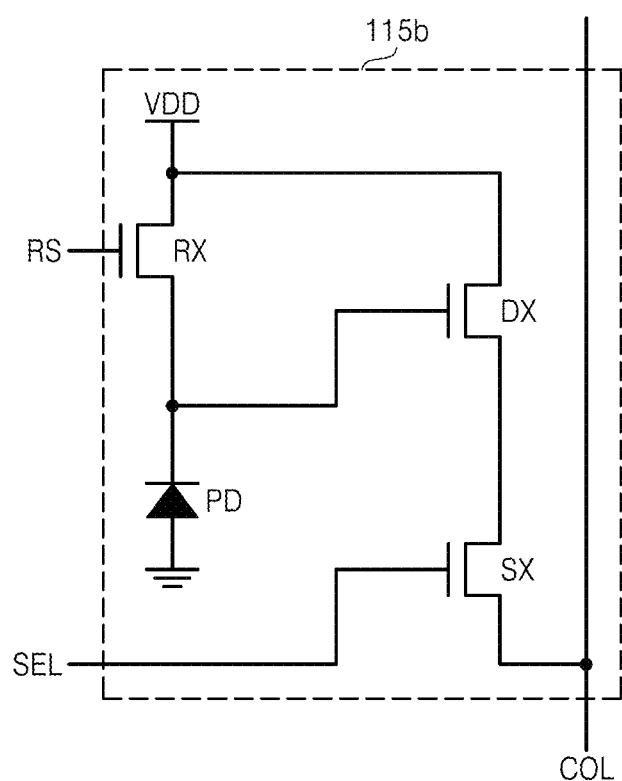

Referring to FIG. 3B, a unit pixel 115b has a 3-transistor (3T) structure that may include the photodiode PD, the reset transistor RX, the drive transistor DX, and the select transistor SX. Photocharge generated in the photodiode PD may be directly accumulated at the floating diffusion node FD. A pixel signal may be output to a column line according to the operation of the drive transistor DX and the select transistor SX.

Figure 3C:
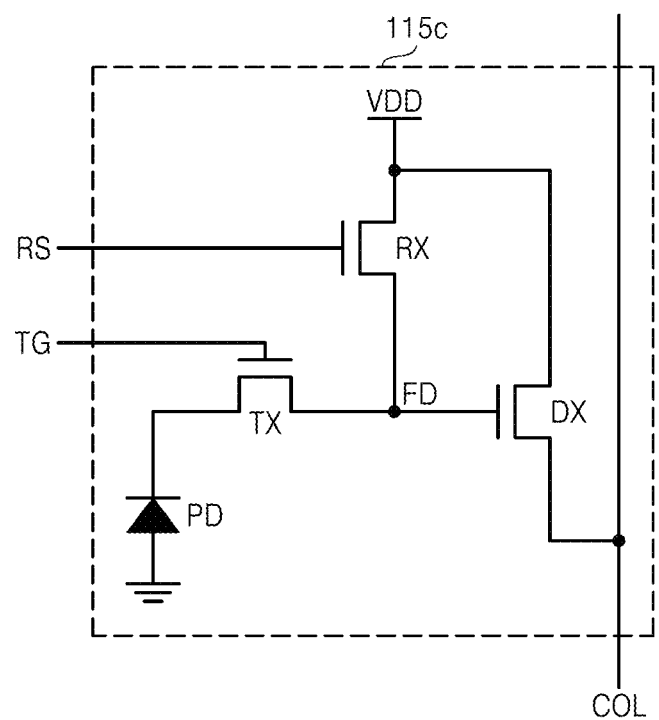

A unit pixel 115c illustrated in FIG. 3C has the 3T structure that may include the photodiode PD, the transfer transistor TX, the reset transistor RX, and the drive transistor DX. The reset transistor RX may be implemented by an n-channel depression type transistor. The reset transistor RX may reset the floating diffusion node FD to the power supply voltage VDD or to a low level (e.g., 0 V) in response to the reset control signal RS received from the row driver 120, thereby performing a similar function to the select transistor SX.

Figure 3D:
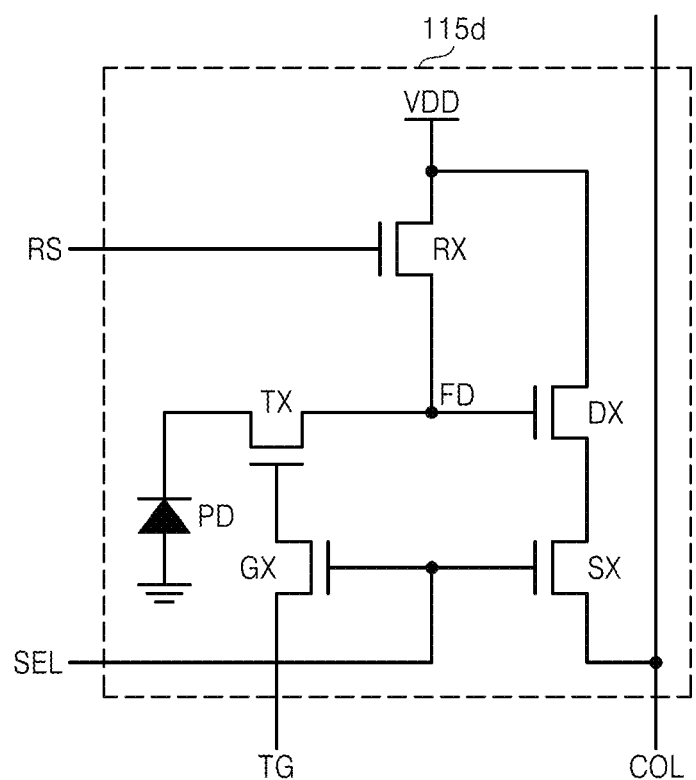

A unit pixel 115d illustrated in FIG. 3D has a 5-transistor (5T) structure that includes the photodiode PD, the transfer transistor TX, the reset transistor RX, the drive transistor DX, the select transistor SX, and one more transistor GX.

Figure 3E:
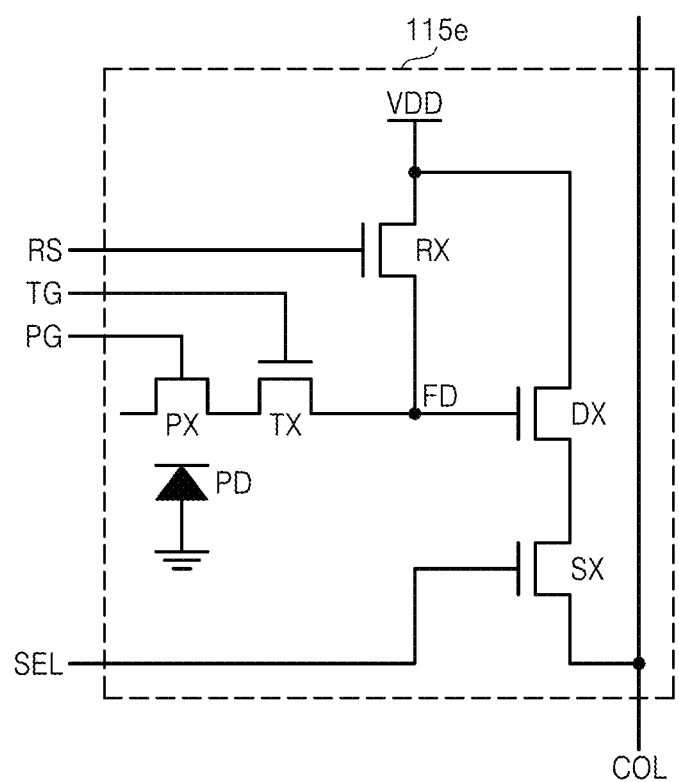

A unit pixel 115e illustrated in FIG. 3E has the 5T structure that includes the photodiode PD, the transfer transistor TX, the reset transistor RX, the drive transistor DX, the select transistor SX, and one more transistor PX.

Figure 4:
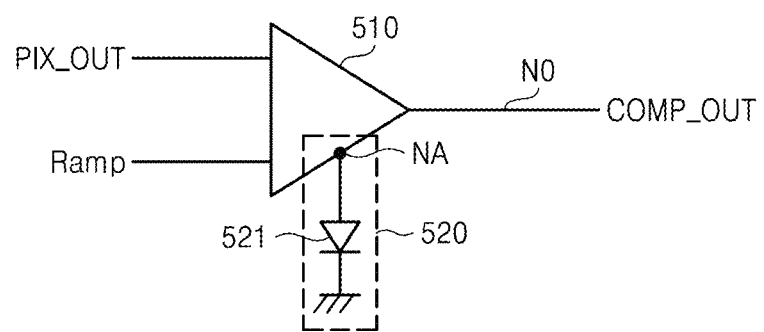
FIG. 4 is a schematic circuit diagram of a column comparator circuit according to some embodiments of the inventive concepts.

FIG. 4 is a schematic circuit diagram of a column comparator circuit 141 according to some embodiments of the inventive concepts. The column comparator circuit 141 includes a comparator 510 and a restriction circuit 520.

The comparator 510 compares a pixel signal PIX_OUT output from the pixel array 110 with the ramp signal Ramp and outputs a comparison result signal COMP_OUT.

The restriction circuit 520 is connected to at least one node (hereinafter, referred to as connection node) NA of the comparator 510, and restricts a characteristic (e.g., voltage and/or current) of a signal of the connection node NA to a desired (or, alternatively a predetermined) range. The connection node NA may be an internal node of comparator 510 or an output node N0 of comparator 510.

Figure 5:
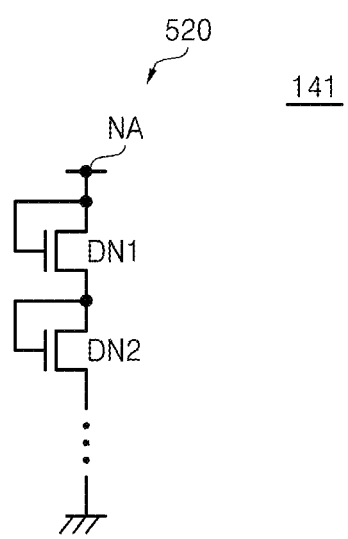
FIG. 5 is a circuit diagram of a restriction circuit illustrated in FIG. 4.

The restriction circuit 520 may include at least one diode 521 connected in series between the connection node NA of the comparator 510 and a ground. The diode 521 may be implemented by n-channel MOS (NMOS) transistors DN1 and DN2 having diode-connection, as shown in FIG. 5.

In some embodiments, the connection node NA is the output node N0 of comparator 510. Here, the restriction circuit 520 restricts the comparison result signal COMP_OUT output from the comparator 510 so that the comparison result signal COMP_OUT does not go above an upper limit.

For instance, if the comparison result signal COMP_OUT from the comparator 510 is higher than the upper limit, the restriction circuit 520 creates a current path from the output node N0 of the comparator 510 to ground using a diode characteristic, thereby reducing or eliminating image artifacts such as row-wise banding noise and sunspots.

The row-wise banding noise is noise appearing in an image in a horizontal direction and is also called horizontal pattern noise. Sunspots are black-colored noise appearing around a bright part in an image (a) shown in FIG. 6. Sunspots usually appear around a bright object (e.g., a fluorescent lamp) in a form of a black spot when the bright object is photographed.

These image artifacts can be suppressed or eliminated using a restriction circuit according to some embodiments of the inventive concepts.

Figure 7:
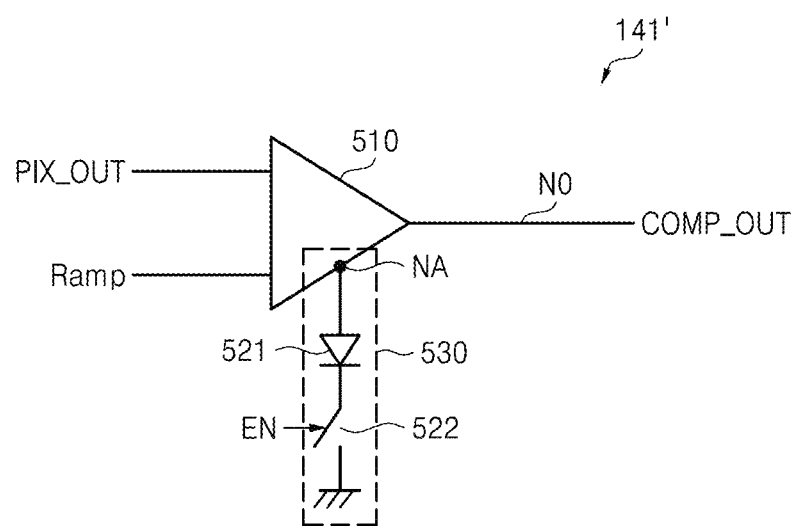
FIG. 7 is a schematic circuit diagram of a column comparator circuit according to other embodiments of the inventive concepts.

FIG. 7 is a schematic circuit diagram of a column comparator circuit 141' according to other embodiments of the inventive concepts. The column comparator circuit 141' illustrated in FIG. 7 is similar to the column comparator circuit 141 illustrated in FIG. 4, and therefore, only differences therebetween will be described to avoid redundancy. A restriction circuit 530 included in the column comparator circuit 141' further includes a switch 522 as compared to the restriction circuit 520 illustrated in FIG. 4.

The switch 522 is connected to the at least one diode 521 to selectively enable the restriction circuit 530. For instance, the switch 522 may be turned on or off in response to a restriction circuit enable signal EN. When the switch 522 is turned on, the restriction circuit 530 is enabled and operates normally. When the switch 522 is turned off, the restriction circuit 530 is disabled.

When the operation period of the comparator 510 is largely divided into an initial period and a comparison period, the switch 522 may be disabled in the initial period of the comparator 510 and may be enabled in the comparison period of the comparator 510. This will be described in greater detail below.

Figure 8:
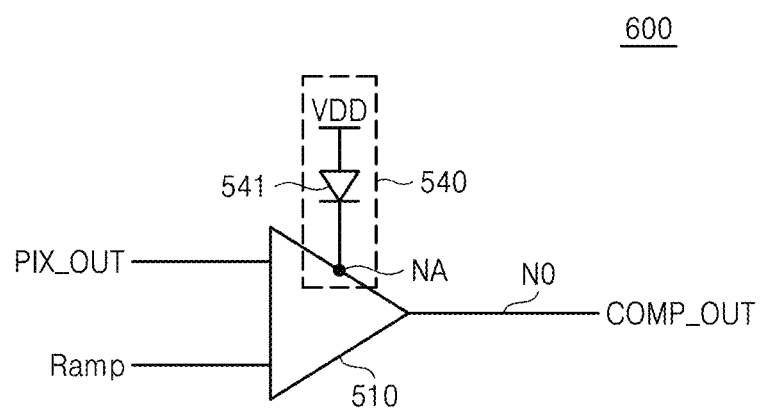
FIG. 8 is a schematic circuit diagram of a column comparator circuit according to further embodiments of the inventive concepts.

FIG. 8 is a schematic circuit diagram of a column comparator circuit 600 according to further embodiments of the inventive concepts. This column comparator circuit 600 may be used instead of column comparator circuit 141. Referring to FIG. 8, the column comparator circuit 600 includes the comparator 510 and a restriction circuit 540.

The comparator 510 compares the pixel signal PIX_OUT output from the pixel array 110 with the ramp signal Ramp and outputs the comparison result signal COMP_OUT.

The restriction circuit 540 is connected to at least connection node NA of the comparator 510, and restricts a characteristic (e.g., voltage and/or current) of a signal of the connection node NA to a desired (or, alternatively a predetermined) range. The connection node NA may be an internal node of comparator 510 or an output node N0 of comparator 510.

The restriction circuit 540 may include at least one diode 541 connected in series between the connection node NA of the comparator 510 and a power supply VDD.

In some embodiments that the connection node NA is the output node N0 of comparator 510, the restriction circuit 540 restricts the comparison result signal COMP_OUT output from the comparator 510 so that the comparison result signal COMP_OUT does not go below a lower limit. For instance, when the comparison result signal COMP_OUT from the comparator 510 is lower than the lower limit, the restriction circuit 540 creates a current path from the power supply VDD to the output node N0 of the comparator 510 using a diode characteristic, thereby inhibiting the comparison result signal COMP_OUT from going below the lower limit.

Figure 9:
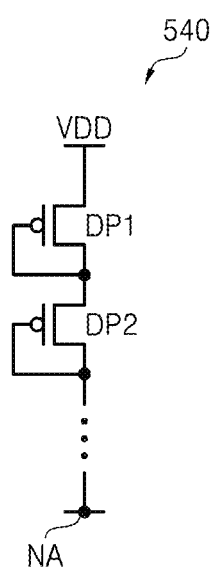
FIG. 9 is a circuit diagram of a restriction circuit illustrated in FIG. 8.

Although not shown, the restriction circuit 540 may also include a switch connected to the diode 541 to selectively enable the restriction circuit 540, like the embodiment illustrated in FIG. 7. The diode 541 may be implemented by p-channel MOS (PMOS) transistors DP1 and DP2 having diode-connection, as shown in FIG. 9.

The comparator 510 may be implemented as one of various types. For instance, the comparator 510 may be implemented as a 1-stage amplifier or at least 2-stage amplifier. The comparator 510 may also be implemented as PMOS or NMOS type. When the comparator 510 is PMOS type, the restriction circuit 520 or 530 restricting the upper limit may be used as shown in FIG. 4 or 7. When the comparator 510 is NMOS type, the restriction circuit 540 restricting the lower limit may be used as shown in FIG. 8.

In other embodiments of the inventive concepts, a restriction circuit may be used to extend the input range of a comparison circuit.

The lower and upper limits may be selectively adjusted. In addition, restriction circuits may be used in various ways according to their purpose in a comparison circuit.

Figure 10A:
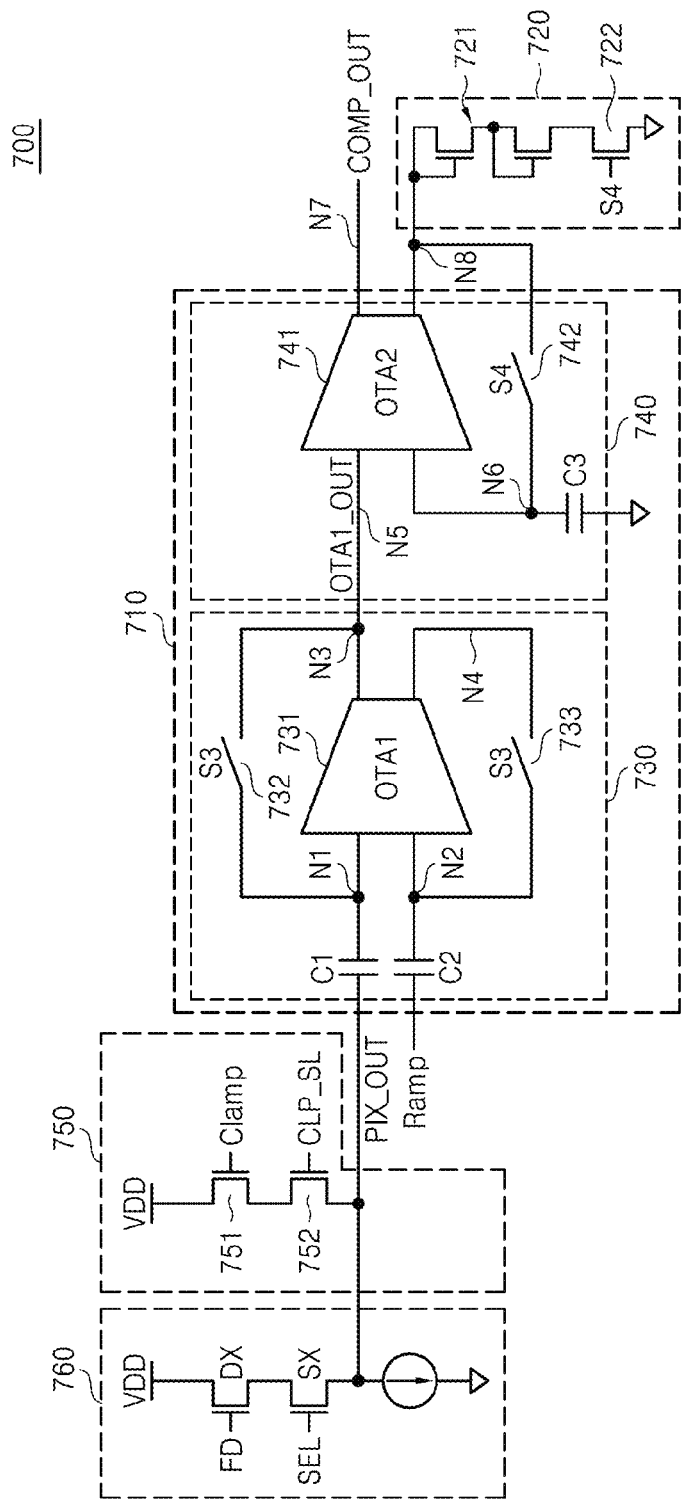
FIG. 10A is a circuit diagram of a column comparator circuit according to other embodiments of the inventive concepts.
Figure 11:
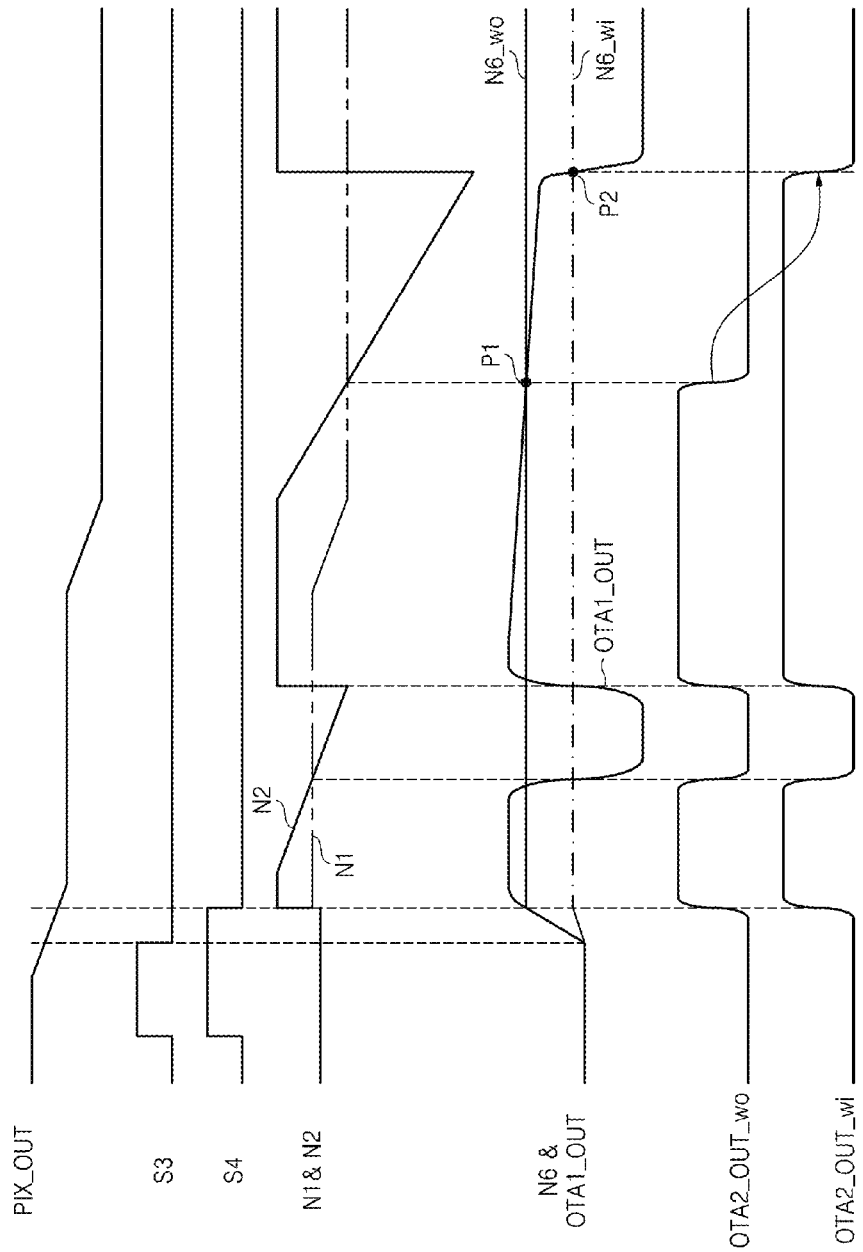
FIG. 11 is a schematic signal timing chart of the column comparator circuit illustrated in FIG. 10.

FIG. 10A is a circuit diagram of a column comparator circuit 700 according to other embodiments of the inventive concepts. The column comparator circuit 700 may replace the column comparator circuit 141. FIG. 11 is a schematic signal timing chart of the column comparator circuit 700 illustrated in FIG. 10A.

The column comparator circuit 700 includes a comparison block 710 and a restriction circuit 720. A clamp circuit 750 is provided between a unit pixel 760 and the comparison block 710. Reference numeral 760 in FIG. 10A denotes a part of one of the unit pixels 115a through 115e respectively illustrated in FIGS. 3A through 3E. The clamp circuit 750 is located in front of the column comparator circuit 700 and restricts a level of the pixel signal PIX_OUT input to the column comparator circuit 700.

The comparison block 710 may include at least two comparators 730 and 740 in two stages. The comparison block 710 includes a first stage comparator 730 and a second stage comparator 740 in the embodiments illustrated in FIG. 10A, but the inventive concepts are not restricted thereto.

The first stage comparator 730 receives the pixel signal PIX_OUT and the ramp signal Ramp as inputs. The second stage comparator 740 receives an output signal OTA1_OUT of the first stage comparator 730 as an input. The first stage comparator 730 includes a first amplifier 731, a first input capacitor C1, a second input capacitor C2, a first switch 732, and a second switch 733. The first amplifier 731 has first and second input nodes N1 and N2 and first and second output nodes N3 and N4.

Figure 10B:
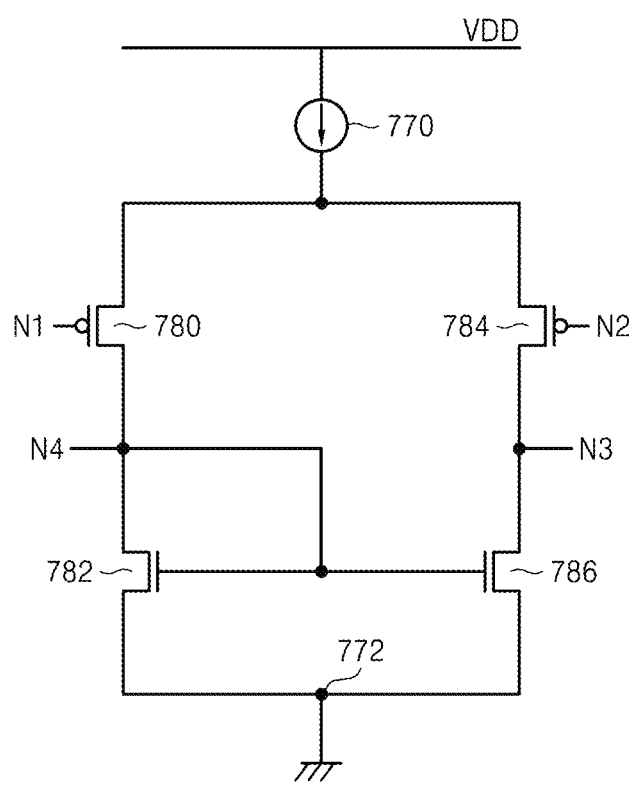
FIG. 10B illustrates the first amplifier in the column comparator circuit of FIG. 10A according to one embodiment.

FIG. 10B illustrates the first amplifier 731 in greater detail. As shown, the output node N4 is between a PMOS transistor 780 and an NMOS transistor 782. The PMOS transistor 780 and the NMOS transistor 782 are connected in series between a constant current source 770 and a common node 772. The output node N3 is between a PMOS transistor 784 and an NMOS transistor 786. The PMOS transistor 784 and the NMOS transistor 786 are connected in series between the constant current source 770 and the common node 772. The gate of the PMOS transistor 780 is connected to the input node N1, and the gate of the PMOS transistor 784 is connected to the input node N2. The gates of the NMOS transistors 782 and 786 are connected together and are connected to the output node N4. The constant current source 770 is connected to a power supply voltage, and the common node 772 is connected to ground. Returning to FIG. 10A, the first input capacitor C1 is connected to a pixel signal input node, to which the pixel signal PIX_OUT is input, and to the first input node N1 of the first amplifier 731. The second input capacitor C2 is connected between a ramp input node, to which the ramp signal Ramp is input, and the second input node N2 of the first amplifier 731. The first switch 732 is connected between the first input node N1 and the first output node N3 of the first amplifier 731 and operates in response to a switch control signal S3. The second switch 733 is connected between the second input node N2 and the second output node N4 of the first amplifier 731 and operates in response to the switch control signal S3.

Figure 10C:
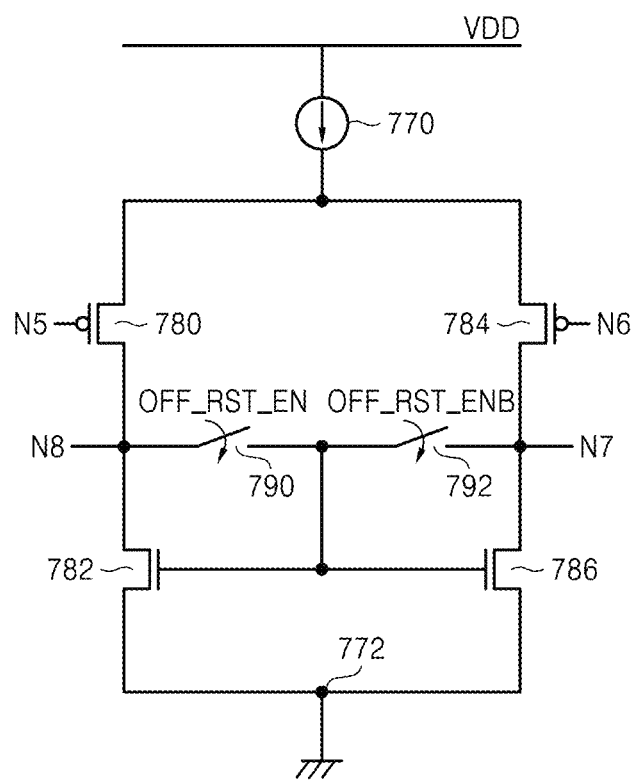
FIG. 10C illustrates the second amplifier in the column comparator circuit of FIG. 10A according to one embodiment

The second stage comparator 740 includes a second amplifier 741, a third capacitor C3, and a third switch 742. The second amplifier 741 has first and second input nodes N5 and N6 and first and second output nodes N7 and N8. FIG. 10C illustrates the second amplifier 741 in greater detail. As shown, the second amplifier 741 has the same structure as the first amplifier 731 except that the gates of the NMOS transistors 782 and 786 are connected to the output node N8 by a first switch 790, and are connected to the output node N7 by a second switch 792. The first switch 790 opens and closes in response to an enable signal OFF_RST_EN, while the second switch 792 opens and closes in response to an inverse of the enable signal OFF_RST_ENB. The enable signal and inverse enable signal may be supplied by the timing generator 170. Also, in FIG. 10C, the input nodes are labeled N5 and N6, and the output nodes are labeled N7 and N8.

Returning to FIG. 10A, the third capacitor C3 is connected between the second input node N6 of the second amplifier 741 and a ground voltage. The third switch 742 is connected between the second input node N6 and the second output node N8 of the second amplifier 741 and operates in response to a switch control signal S4.

The first input node N5 of the second amplifier 741 is connected to the first output node N3 of the first amplifier 731. The restriction circuit 720 is connected between the second output node N8 of the second amplifier 741 and the ground voltage. The restriction circuit 720 may include at least one diode 721 and a switch 722, which are connected in series between the output node N8 of the second amplifier 741 and the ground. The switch 722 operates in response to a restriction circuit enable signal. In the current embodiments, the switch control signal S4 is used as the restriction circuit enable signal. It will be appreciated that the control signal may be supplied by the timing generator 170.

The operation of the column comparator circuit 700 will be described with reference to FIGS. 10A-C and 11. Despite that the level of a reset signal in the pixel signal PIX_OUT should be ideally constant, the level may gradually decreases due to bright light. In other words, as shown in FIG. 11, the level of the pixel signal PIX_OUT may linearly decrease. However, the pixel signal PIX_OUT does not decrease below a certain level due to the clamp circuit 750.

In an auto-zero phase of the column comparator circuit 700 during which the switch control signals S3 and S4 are enabled, comparator initialization is performed to make levels at the two input nodes N1 and N2 of the first stage comparator 730 the same and levels at the two input nodes N5 and N6 of the second stage comparator 740 the same.

As illustrated in FIG. 11, when the pixel signal PIX_OUT decreases linearly, the first amplifier 731 amplifies the pixel signal PIX_OUT having a decreasing slope by the gain of the first amplifier 731, so that the first stage comparator 730 outputs an output signal OTA1_OUT having a rapidly-increasing slope.

Accordingly, when it is assumed that the restriction circuit 720 is not used, a voltage N6_wo of the second input node N6 of the second stage comparator 740 becomes equal to a direct current (DC) voltage of the amplified output signal OTA1_OUT during a period while the switch control signal S4 is enabled. Thereafter, when the switch control signal S4 is disabled, the second input node N6 of the second stage comparator 740 stores an amplified DC voltage. In other words, when the restriction circuit 720 is not used, the second input node N6 of the second stage comparator 740 has an abnormally amplified DC voltage.

In FIG. 11, N6_wo means the voltage of the second input node N6 of the first amplifier 731 and OTA2_OUT_wo means an output signal on output node N7 of the second stage comparator 740 in the case that the restriction circuit 720 is not used, N6_wi means the voltage of the second input node N6 of the first amplifier 731 and OTA2_OUT_wi means an output signal on output node N7 of the second stage comparator 740 in the current embodiment according to this inventive concepts where the restriction circuit 720 is used.

For comparison with the inventive concepts, a case that the restriction circuit 720 is not used is described in detail.

Since the output DC voltage level of the first amplifier 731 is low due to the characteristics of the first amplifier 731, the second stage comparator 740 cannot perform comparison accurately because of the amplified DC voltage stored in the second input node N6 of the second amplifier 741. For instance, there may be no crossing point between the output signal OTA1_OUT of the first stage comparator 730 and the voltage N6_wo of the second input node N6 of the first amplifier 731, or the output signal OTA1_OUT and the voltage N6_wo of the second input node N6 may cross at an unwanted point P1.

The restriction circuit 720 restricts the DC voltage level of the second input node N6 of the second amplifier 741 not to be higher that a desired (or, alternatively a predetermined) upper limit, as expressed by "N6_wi" in FIG. 11. In other words, in the embodiments including the restriction circuit 720, a level N6_wi of the second input node N6 of the second stage comparator 740 increases according to the DC voltage of the amplified output signal OTA1_OUT while the switch control signal S4 is enabled and then is restricted to the upper limit by the restriction circuit 720.

As described above, since the DC voltage level N6_wi of the second input node N6 of the second amplifier 741 is restricted not to be higher than the upper limit by the restriction circuit 720, the output signal OTA1_OUT of the first stage comparator 730 and the voltage N6_wo of the second input node N6 of the second amplifier 741 may cross at an appropriate point P2.

When the restriction circuit 720 is not used, an output signal OTA2_OUT_wo of the second stage comparator 740 changes in level at the point P1. As a result, black-colored noise, i.e., sunspots appear in the image (a) in FIG. 6 or noise a bit brighter than black appears in an image (b) in FIG. 6. The image (a) in FIG. 6 corresponds to a case where neither the restriction circuit 720 nor the clamp circuit 750 is used. The image (b) in FIG. 6 corresponds to a case where the clamp circuit 750 is used but the restriction circuit 720 is not used.

Contrarily, when the restriction circuit 720 is used, an output signal OTA2_OUT_wi of the second stage comparator 740 changes in level at the point P2. As a result, black or gray noise does not appear in an image (c) in FIG. 6 even if the object is bright.

Figure 6:
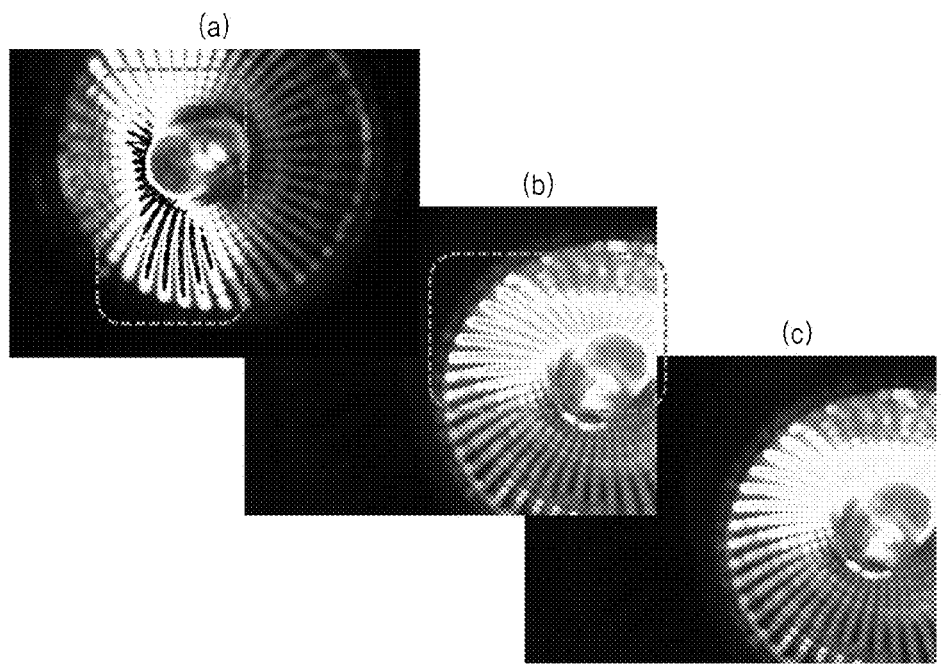
FIG. 6 is a diagram for explaining a sunspot effect.

When neither the restriction circuit 720 nor the clamp circuit 750 is used, sunspots are worst as shown in the image (a) in FIG. 6. When the clamp circuit 750 is used, sunspots are a little relieved as shown in the image (b) in FIG. 6. When both the restriction circuit 720 and the clamp circuit 750 are used, sunspots are mostly eliminated as shown in the image (c) in FIG. 6.

The restriction circuit 720 is connected to the output node N8 of the second stage comparator 740 in the embodiments illustrated in FIG. 10A. However, the restriction circuit 720 may be directly connected to the second input node N6 of the second stage comparator 740.

Figure 12:
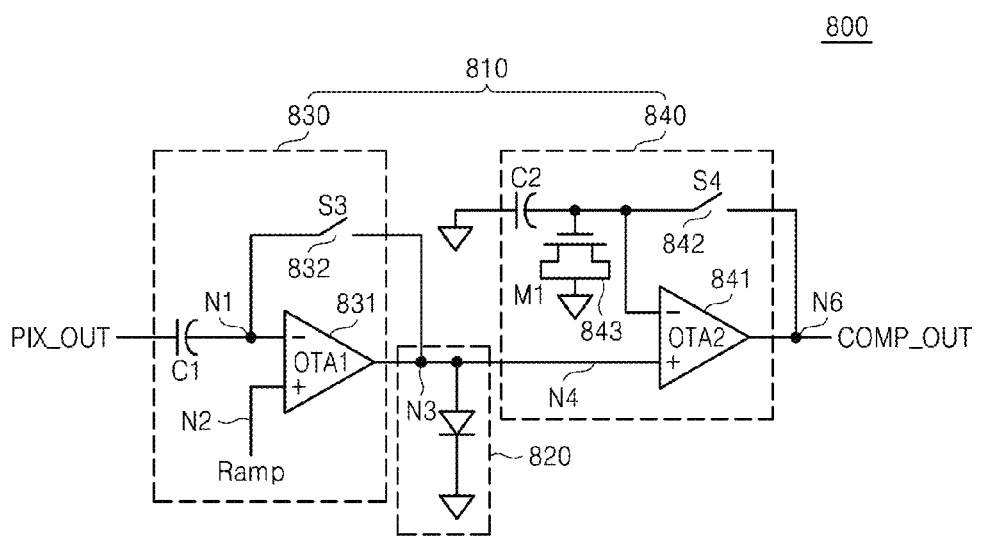
FIG. 12 is a circuit diagram of a column comparator circuit according to yet other embodiments of the inventive concepts.

FIG. 12 is a circuit diagram of a column comparator circuit 800 according to yet other embodiments of the inventive concepts. The column comparator circuit 800 may replace the column comparator circuit 141. FIG. 13C is a circuit diagram of a first amplifier 831 and a restriction circuit 820, which are illustrated in FIG. 12, according to some embodiments of the inventive concepts.

Referring to FIGS. 12 and 13C, the column comparator circuit 800 includes a comparison block 810 and the restriction circuit 820. The comparison block 810 may include at least two-stage comparator. The comparison block 810 in the current embodiments illustrated in FIG. 12 includes a first stage comparator 830 and a second stage comparator 840, but the inventive concepts are not restricted thereto.

The first stage comparator 830 receives the pixel signal PIX_OUT and the ramp signal Ramp as inputs. The second stage comparator 840 receives an output signal of the first stage comparator 830 as an input. The first stage comparator 830 includes a first amplifier 831, a first input capacitor C1, and a first switch 832. The first amplifier 831 has first and second input nodes N1 and N2 and a first output node N3. The first input capacitor C1 is connected to a pixel signal input node, to which the pixel signal PIX_OUT is input, and to the first input node N1 of the first amplifier 831.

The first switch 832 is connected between the first input node N1 and the output node N3 of the first amplifier 831 and operates in response to the switch control signal S3.

The second stage comparator 840 includes a second amplifier 841, a second capacitor C2, and a second switch 842. The second amplifier 841 has first and second input nodes N4 and N5 and an output node N6. The second capacitor C2 is connected between the second input node N5 of the second amplifier 841 and the ground voltage. The second switch 842 is connected between the second input node N5 and the output node N6 of the second amplifier 841 and operates in response to the switch control signal S4. The first input node N4 of the second amplifier 841 is connected to the output node N3 of the first amplifier 831.

The restriction circuit 820 may include at least one diode 821 and a switch 822, which are connected in series between the output node N3 of the first stage comparator 830 and the ground, as shown in FIG. 13C. The switch 822 operates in response to a restriction circuit enable signal SW. Referring to FIG. 13C, the first amplifier 831 may be implemented by a mirrored operational transconductance amplifier (OTA).

The first amplifier 831 may include first through fourth NMOS transistors MNIN, MNIP, MN0, and MN1; first through sixth PMOS transistors MP0, MP1, MP2, MP3, MP4, and MP5; and a bias transistor MNBN. A negative input signal INN (at node N1) is input to the first NMOS transistor MNIN and a positive input signal INP (at node N2) is input to the second NMOS transistor MNIP. Sources of the first and second NMOS transistors MNIN and MNIP are connected in common to a drain of the bias transistor MNBN.

The first and second PMOS transistors MP0 and MP1 are connected to each other in a current mirror form. The fourth and sixth PMOS transistors MP3 and MP5 are also connected to each other in the current mirror form. The third and fourth NMOS transistors MN0 and MN1 are also connected to each other in the current mirror form.

Gates of the third and fifth PMOS transistors MP2 and MP4 are connected to each other. Drains of the fifth PMOS transistor MP4 and the fourth NMOS transistor MN1 are connected to an output node OUT.

When it is assumed that the restriction circuit 820 connected to the output node OUT of the first amplifier 831 is not used, current changes before and after the decision of the comparator 830. Namely, when the output of the comparator 830 changes so does the current flowing through the amplifier 831. As a result, row-wise banding noise occurs. This will be described with reference to FIGS. 13A and 13B.

Figure 13A:
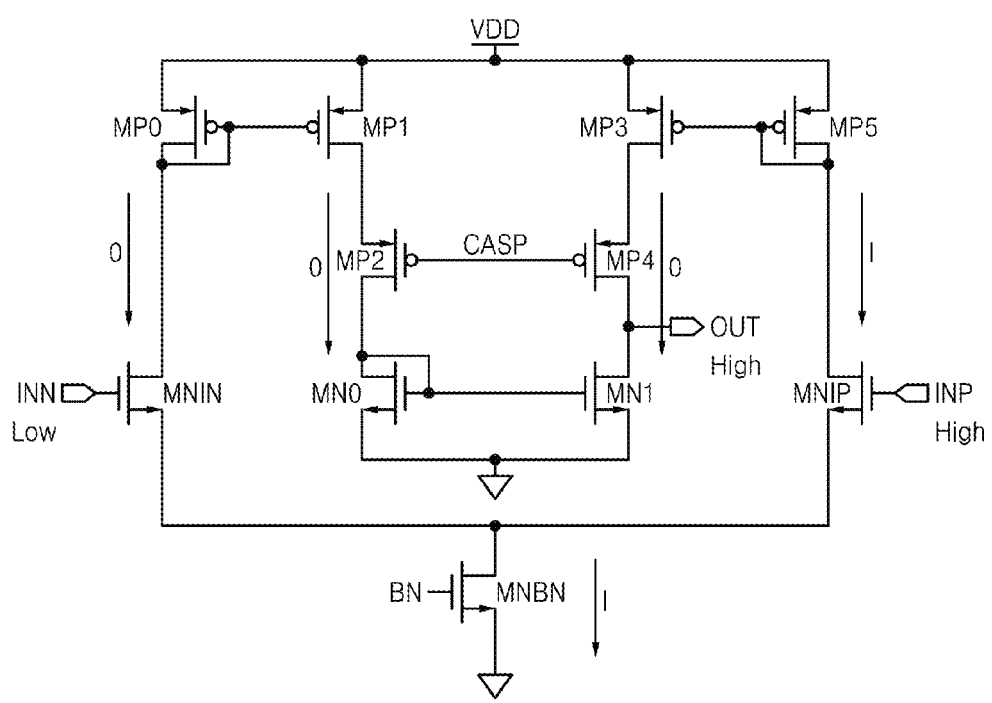
FIG. 13A is a diagram showing the flow of current before decision of the amplifier illustrated in FIG. 13C when there is no restriction circuit connected to an output node of the amplifier.
Figure 13B:
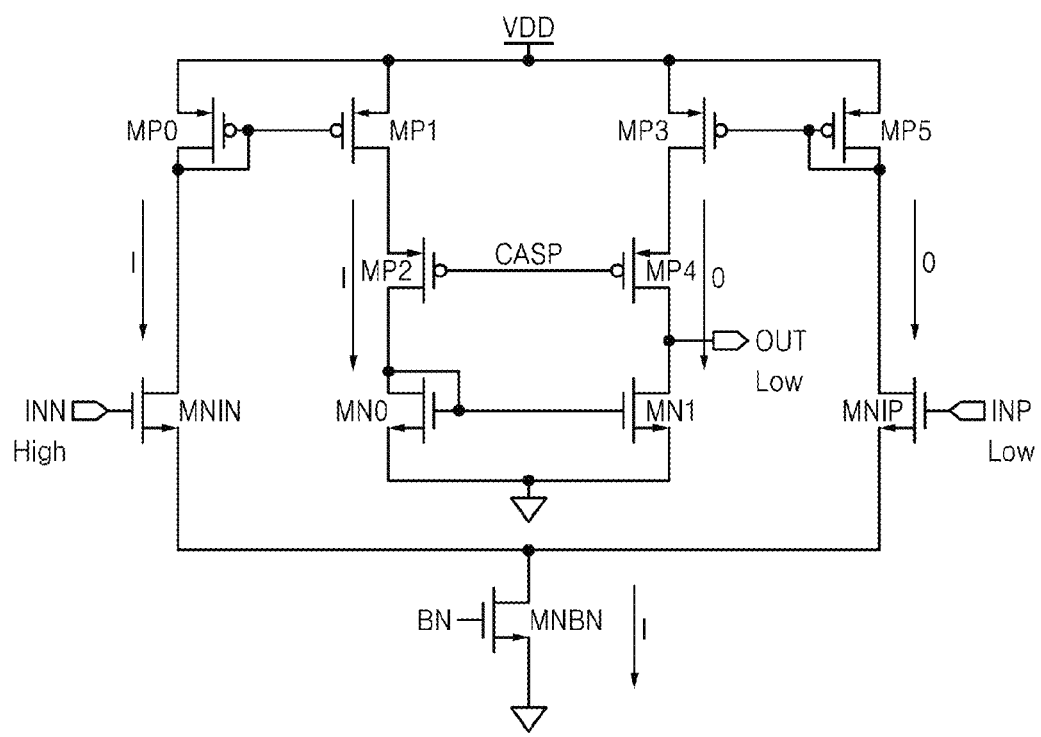
FIG. 13B is a diagram showing the flow of current after the decision of the amplifier illustrated in FIG. 13C when there is no restriction circuit connected to the output node of the amplifier.
Figure 13C:
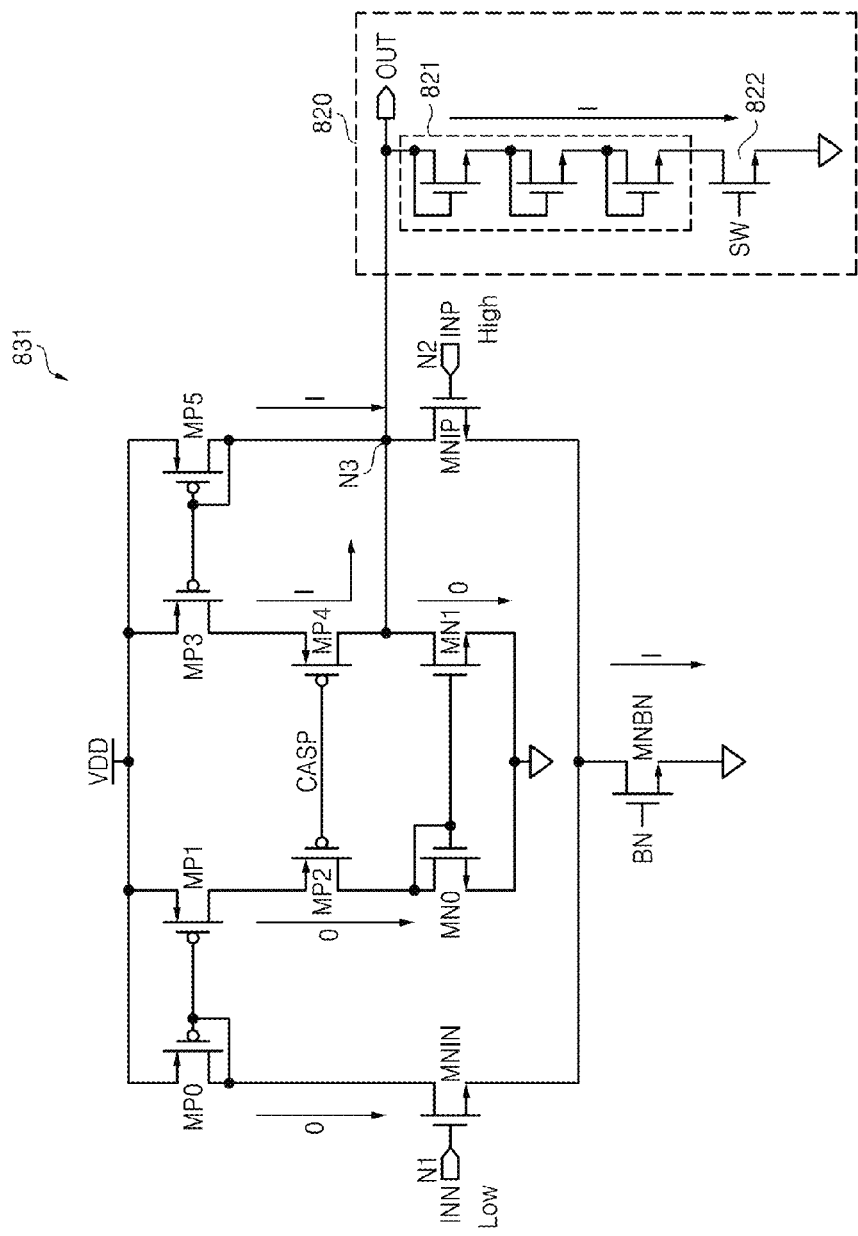
FIG. 13C is a circuit diagram of a first amplifier and a restriction circuit, which are illustrated in FIG. 12, according to some embodiments of the inventive concepts.

FIG. 13A is a diagram showing the flow of current before the decision of the first amplifier 831 illustrated in FIG. 13C when the restriction circuit 820 connected to the output node OUT of the first amplifier 831 is not used. FIG. 13B is a diagram showing the flow of current after the decision of the first amplifier 831 illustrated in FIG. 13C when the restriction circuit 820 connected to the output node OUT of the first amplifier 831 is not used.

It is assumed that the positive input signal INP is higher than the negative input signal INN before the decision of the first amplifier 831. In this case, when it is assumed that a current of "I" conceptually flows in a path from the power supply voltage VDD to the ground via the sixth PMOS transistor P5, the second NMOS transistor MNIP, and the bias transistor MNBN, there is little current flowing in other paths.

Since the fourth and sixth PMOS transistors MP3 and MP5 are connected to each other in the current mirror form, the current of "I" is supposed to flow through the fourth PMOS transistor P3. However, since the positive input signal INP is higher than the negative input signal INN, a level at the output node OUT is high. As a result, almost no current flows through the fourth PMOS transistor P3. Consequently, before the decision of the first amplifier 831 in which the positive input signal INP is higher than the negative input signal INN, it may be said that the current of "I" flows in total in the first amplifier 831.

However, when the positive input signal INP is lower than the negative input signal INN, an output of the first amplifier 831 transits from a high level to a low level, which may correspond to a decision point of the first amplifier 831.

Referring to FIG. 13B, when it is assumed that the current of "I" conceptually flows through the first PMOS transistor MP0 and the first NMOS transistor MNIN from the power supply voltage VDD after the decision of the first amplifier 831. Here, the positive input signal INP is lower than the negative input signal INN, and the current of "I" flows through the second PMOS transistor MP1 connected in the current mirror form. It can be said that a current of "2I" flows in total in the first amplifier 831.

As described above, since the intensity of current flowing in the first amplifier 831 is different before and after the decision of the first amplifier 831, row-wise banding noise occurs and the quality of an image is degraded.

Figure 14A:
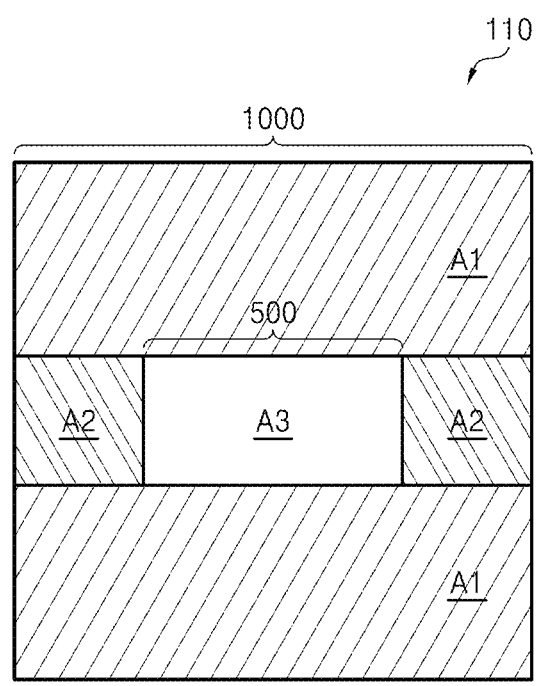
FIGS. 14A through 14C are diagrams for explaining the change of the current in the amplifier illustrated in FIGS. 13B and 13C.
Figure 14B:
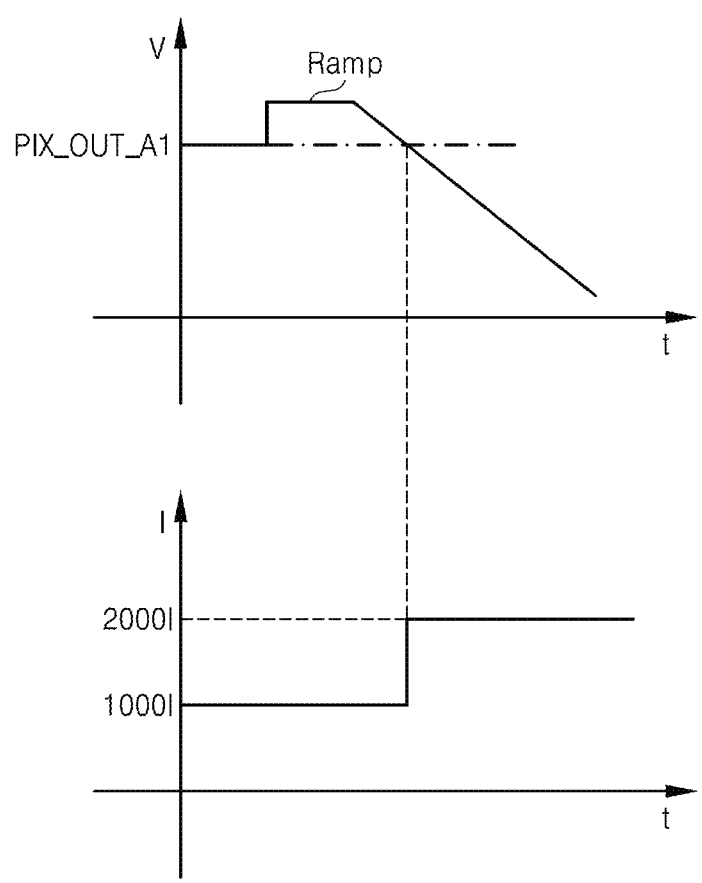
Figure 14C:
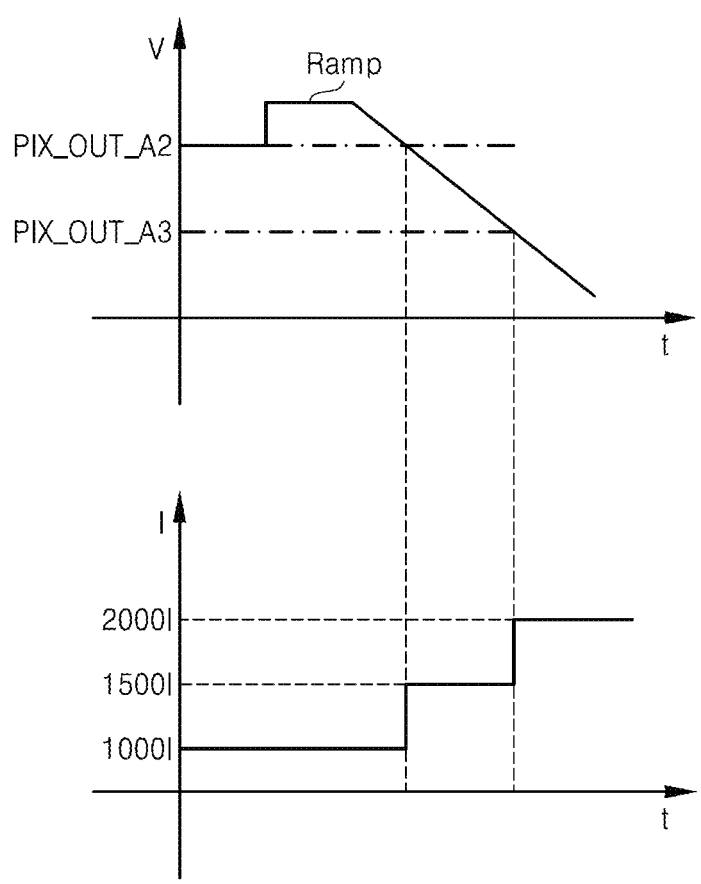

FIGS. 14A through 14C are diagrams for explaining the change of the current in the first amplifier 831 illustrated in FIGS. 13A and 13B. Referring to FIG. 14A, it is assumed that 1000 pixels are arranged in each of row in the pixel array 110. In other words, it is assumed that the number of columns in the pixel array 110 is 1000. It is also assumed that first and second areas A1 and A2 are dark while a third area A3 is bright.

As shown in FIG. 14B, in an operation of the amplifiers shown in FIGS. 13A and 13B, which compare a pixel signal PIX_OUT_A1 output from a row in the first area A1 of the pixel array 110 with the ramp signal Ramp, a current of 1000I flows in total in the amplifiers before the decision of the amplifiers, that is, while the amplifiers compare the pixel signal PIX_OUT_A1 with the ramp signal Ramp. After the decision of the amplifiers, that is, when the ramp signal Ramp starts to be lower than the pixel signal PIX_OUT_A1, a current of 2000I flows in total in the amplifiers.

However, as shown in FIG. 14C, in an operation of the amplifiers shown in FIGS. 13A and 13B, which compare pixel signals PIX_OUT_A2 and PIX_OUT_A3 output from a row in the second and third areas A2 and A3 with the ramp signal Ramp, a current of 1000I flows in total in the amplifiers while the ramp signal Ramp is higher than the pixel signal PIX_OUT_A2. Thereafter, while the ramp signal Ramp is lower than the pixel signal PIX_OUT_A2 and higher than the pixel signal PIX_OUT_A3, a current of 1500I flows in total in the amplifiers. Starting from a point where the ramp signal Ramp is lower than the pixel signal PIX_OUT_A3, a current of 2000I flows in total in the amplifiers.

Accordingly, although both of the first and second areas A1 and A2 are dark areas, as shown in FIGS. 14B and 14C, darkness is different between the first and second areas A1 and A2 as the current intensity changes. For instance, when the first area A1 is black, the second area A2 may be gray. In other words, the second areas A2 beside the bright area A3 has gray banding noise.

According to the embodiments illustrated in FIGS. 12 and 13C, the restriction circuit 820 connected to the output node OUT of the first amplifier 831 is used to suppress or prevent the intensity of current flowing in the first amplifier 831 from changing.

Referring back to FIG. 13C, when the restriction circuit 820 is provided, a level at the output node OUT is restricted up to a desired (or, alternatively a predetermined) upper limit.

Accordingly, in a case where the positive input signal INP is higher than the negative input signal INN before the decision of the first amplifier 831, when it is assumed that the current of "I" conceptually flows in the path from the power supply voltage VDD to the ground via the sixth PMOS transistor P5, the second NMOS transistor MNIP, and the bias transistor MNBN, the current of "I" also flows through the fourth PMOS transistor MP3 connected in the current mirror form. However, the current flowing through the fourth PMOS transistor MP3 flows to the ground via the restriction circuit 820.

When the restriction circuit 820 is provided, the current of "2I" flows in total in the first amplifier 831 both before and after the decision of the first amplifier 831, and therefore, there is no change in the current intensity in the first amplifier 831. As a result, noise (e.g., row-wise banding noise) occurring due to the change in the current intensity is reduced.

FIG. 15 is a schematic signal timing chart of the column comparator circuit 800 illustrated in FIG. 12. The overall operation of the column comparator circuit 800 will be described with reference to FIGS. 12 through 15. According to the current embodiments, the restriction circuit 820 does not operate during the auto-zero period of the signal S3 or S4, that is, during an "a-c" period. If the restriction circuit 820 operates and restricts a voltage during the auto-zero period, offset cancellation is not accomplished. Accordingly, the restriction circuit 820 is disabled during the auto-zero period but is enabled during only a "d-k" period.

When it is assumed that the amplifiers 831 and 841 do not have an offset, two input signals OTA1_IN− and OTA1_IN+ of the first amplifier 831 are at the same level as two input signals OTA2_IN− and OTA2_IN+ of the second amplifier 841 at a point "a" shown FIG. 15.

In order to convert a rest signal into a digital signal, a desired (or, alternatively a predetermined) offset is applied to the ramp signal Ramp in a "d-e" period. Then, the ramp signal Ramp starts to decrease from a point "e", that is, ramping starts from the point "e". A counter counts time from the point "e" to a point "f" at which the polarity of an output signal of the first amplifier 831 changes. A subtractor circuit or an up-down counter may obtain a difference between an image signal and a reset signal. In the current embodiments, a bit converter and an up-counter may be used to obtain the difference.

After the reset signal is converted into the digital signal, the transfer control signal TG is enabled at a point "h" and the negative input signal OTA1_IN− of the first amplifier 831 or OTA1 is changed by charges, which has been accumulated by the photodiode PD, as shown in FIG. 15. The ramping of the ramp signal Ramp resumes at a point "i" to digitize the image signal. The counter counts time from the point "i" to a point "j" at which the polarity of an output signal of the second amplifier 841 or OTA2 changes.

After the digitization of the image signal is completed, the column comparator circuit 800 is initialized to digitize a next reset signal.

Figure 16:
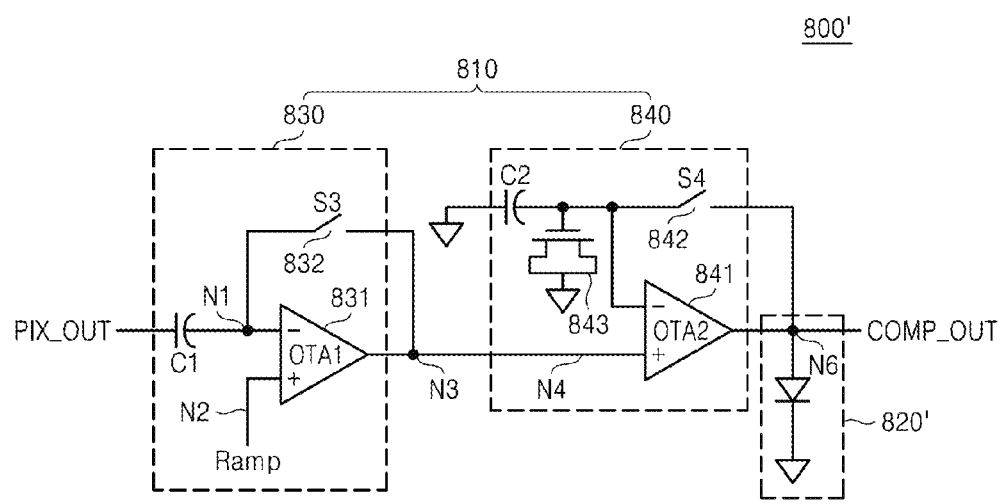
FIG. 16 is a circuit diagram of a column comparator circuit, which is a modification of the column comparator circuit illustrated in FIG. 12, according to still other embodiments of the inventive concepts.

FIG. 16 is a circuit diagram of a column comparator circuit 800', which is a modification of the column comparator circuit 800 illustrated in FIG. 12, according to still other embodiments of the inventive concept. The column comparator circuit 800' illustrated in FIG. 16 is similar to the column comparator circuit 800 illustrated in FIG. 12. Thus, differences between the column comparator circuits 800 and 800' will be mainly described to avoid redundancy.

While the restriction circuit 820 is connected between the output node N3 of the first stage comparator 830 and the ground in the column comparator circuit 800 illustrated in FIG. 12, a restriction circuit 820' is connected between the output node N6 of the second stage comparator 840 and the ground in the column comparator circuit 800' illustrated in FIG. 16.

As described above, according to embodiments of the present invention, a restriction circuit may be applied to a comparator circuit in different ways according to their purpose.

Furthermore, it will be appreciated that the embodiments of FIGS. 12 and 16 may be combined such that a restriction circuit is connected to the output of each of the first and second comparators 830 and 840.

Figure 17:
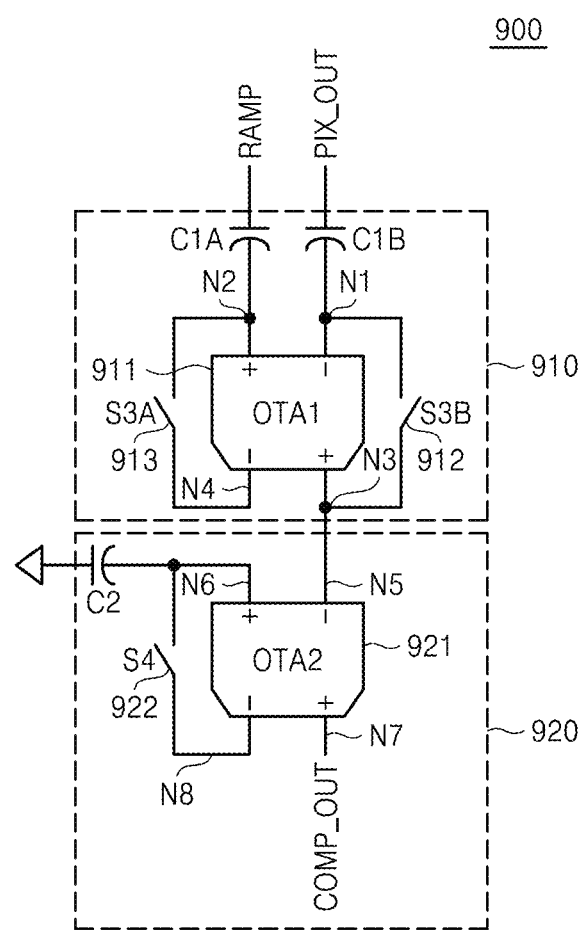
FIG. 17 is a schematic circuit diagram of a column comparator circuit according to further embodiments of the inventive concepts.

FIG. 17 is a schematic circuit diagram of a column comparator circuit 900 according to further embodiments of the inventive concept. Referring to FIG. 17, the column comparator circuit 900 includes a comparison block and a restriction circuit. The comparison block may include an at least two-stage comparator. In the embodiments illustrated in FIG. 17, the comparison block includes a first stage comparator 910 and a second stage comparator 920, but the inventive concepts are not restricted to the current embodiments.

The first stage comparator 910 includes a first amplifier 911, first and second input capacitors C1B and C1A, and first and second switches 912 and 913. The first amplifier 911 has first and second input nodes N1 and N2 and first and second output nodes N3 and N4.

The first input capacitor C1B is connected to a pixel signal input node receiving the pixel signal PIX_OUT and to the first input node N1 of the first amplifier 911. The second input capacitor C1A is connected between a ramp signal input node receiving the ramp signal Ramp and the second input node N2 of the first amplifier 911. The first switch 912 is connected between the first input node N1 and the first output node N3 of the first amplifier 911 and operates in response to a switch control signal S3B. The second switch 913 is connected between the second input node N2 and the second output node N4 of the first amplifier 911 and operates in response to a switch control signal S3A.

The second stage comparator 920 includes a second amplifier 921, a third capacitor C2, and a third switch 922. The second amplifier 921 has first and second input nodes N5 and N6 and first and second output nodes N7 and N8. The third capacitor C2 is connected between the second input node N6 of the second amplifier 921 and the ground voltage.

The third switch 922 is connected between the second input node N6 and the second output node N8 of the second amplifier 921 and operates in response to the switch control signal S4.

The first input node N5 of the second amplifier 921 is connected to the first output node N3 of the first amplifier 911.

Figure 18:
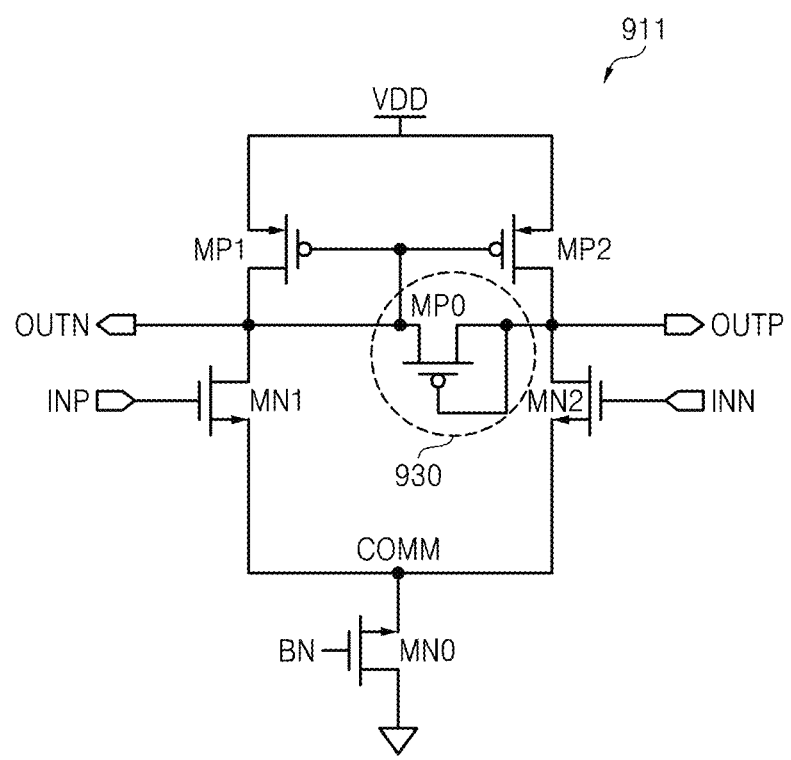
FIG. 18 is a circuit diagram of a first amplifier illustrated in FIG. 17 and a restriction circuit according to some embodiments of the inventive concepts.

FIG. 18 is a circuit diagram of the first amplifier 911 illustrated in FIG. 17 and a restriction circuit 930 according to some embodiments of the inventive concepts. The first amplifier 911 includes first and second NMOS transistors MN1 and MN2, first and second PMOS transistors MP1 and MP2, and a bias transistor MN0.

The positive input signal INP is input to the first NMOS transistor MN1 and the negative input signal INN is input to the second NMOS transistor MN2. Sources of the first and second NMOS transistors MN1 and MN2 are connected in common to a drain of the bias transistor MN0. The first and second PMOS transistors MP1 and MP2 are connected to each other in the current mirror form.

A gate and a drain of the first PMOS transistor MP1 and a drain of the first NMOS transistor MN1 are connected in common to a negative output node OUTN. A drain of the second PMOS transistor MP2 and a drain of the second NMOS transistor MN2 are connected in common to a positive output node OUTP.

The restriction circuit 930 includes at least one diode connected between a first output node N3 (e.g., the positive output node OUTP) and a second output node N4 (e.g., the negative output node OUTN) of the first amplifier 911. The diode may be implemented by a diode-connected PMOS transistor MP0. The diode restricts the swing width of a first output signal OUTP.

Figure 19:
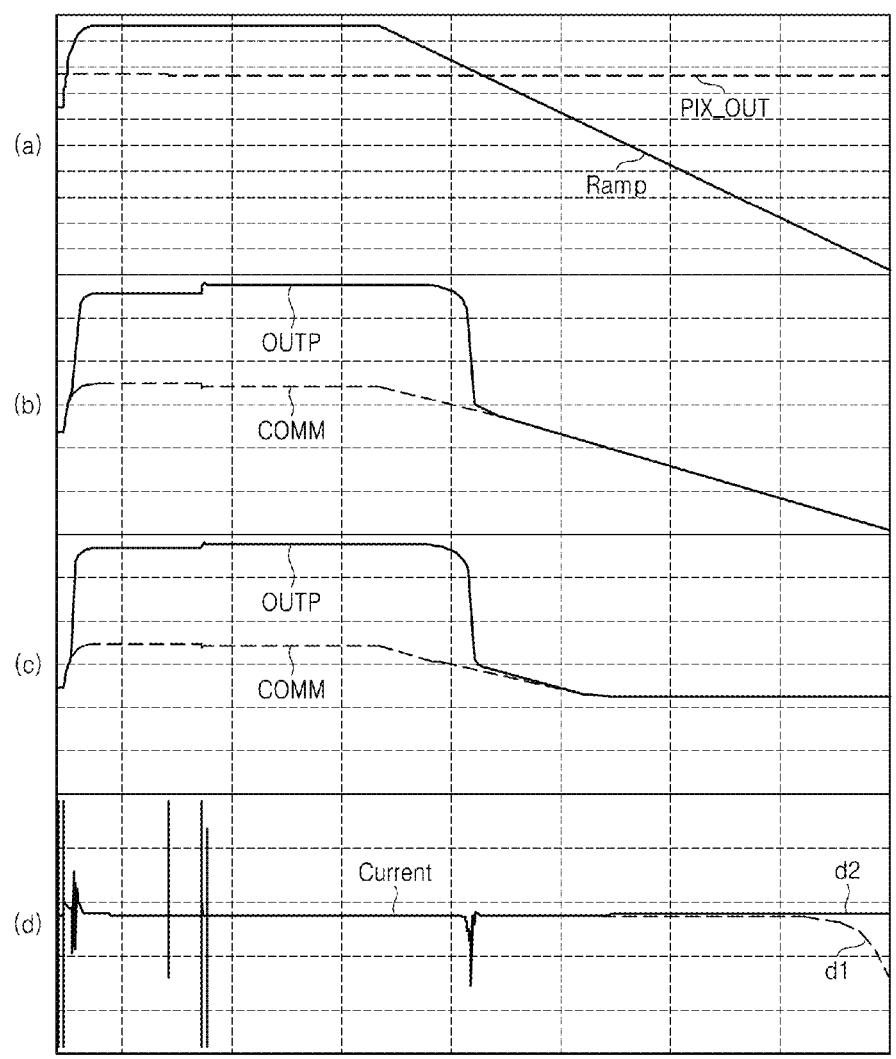
FIG. 19 is a signal timing chart of the amplifier illustrated in FIG. 18 and a comparison example.

FIG. 19 is a signal timing chart of the amplifier 911 illustrated in FIG. 18 and a comparison example. After the decision of the column comparator circuit 900 (e.g., after output of the comparator changes), a low level of the first output signal OUTP is equal to a level of a common node voltage COMM. At this time, the level of the common node voltage COMM is determined by the second input node INN receiving the ramp signal Ramp.

When the ramp signal Ramp continuously decreases and the common node voltage COMM is lower than a saturation voltage of the NMOS transistor MN1 or MN2 during the operation of the ADC 130, the amount of current changes, causing noise. For instance, when the restriction circuit 930 is not provided in the first amplifier 911 illustrated in FIG. 18, the common node voltage COMM continuously decreases as the ramp signal Ramp decreases as shown in a graph (b) in FIG. 19, and therefore, current fluctuation occurs as shown in a curve d1 in a graph (d) in FIG. 19.

Accordingly, after the decision, the swing width of the first output signal OUTP is restricted using the diode MP0, so that the low level of the common node voltage COMM is determined by the first input signal INN. As a result, the change in current is reduced or eliminated. For instance, when the first amplifier 911 includes the restriction circuit 930 as shown in FIG. 18, the common node voltage COMM does not decrease below a lower limit as shown in a graph (c) in FIG. 19 even through the ramp signal Ramp decreases. As a result, as shown in a curve d2 in the graph (d) in FIG. 19, the current does not change.

It will be appreciated that this embodiment may be applied to both the first and second comparators 910 and 920. Also, it will be appreciated that this embodiment may be combined with one of the previous embodiments. For example, the first comparator may be the comparator 910 with the restriction circuit of FIG. 18, and the second comparator may be comparator 840 with the restriction circuit 820' of FIG. 18.

Figure 20:
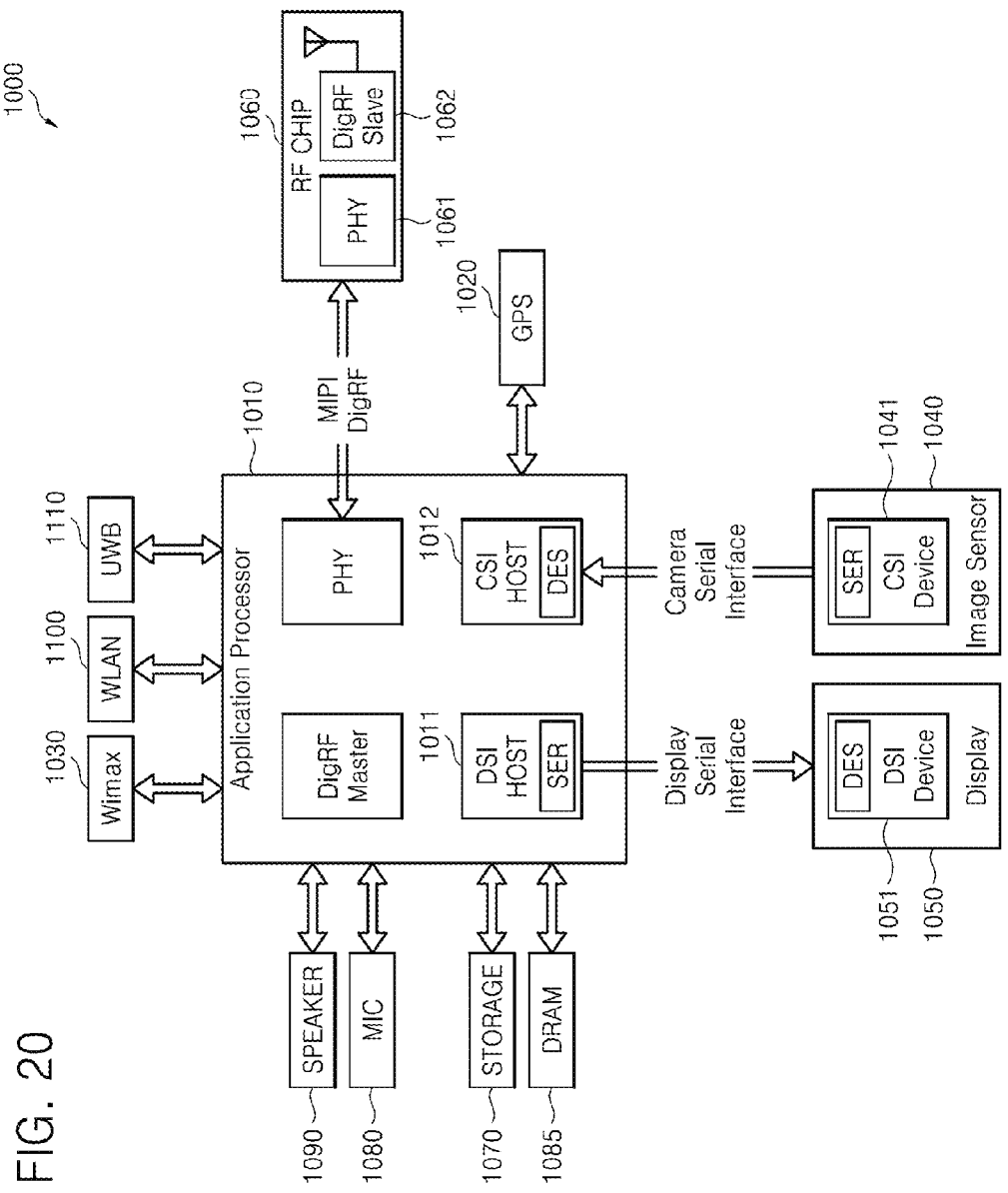
FIG. 20 is a block diagram of an electronic system including an image sensor according to some embodiments of the inventive concepts.

FIG. 20 is a block diagram of an electronic system including an image sensor according to some embodiments of the inventive concept. The electronic system 1000 may be implemented by a data processing apparatus, such as a mobile phone, a personal digital assistant (PDA), a portable media player (PMP), an IP TV, or a smart phone that can use or support the MIPI interface. The electronic system 1000 includes an application processor 1010, an image sensor 1040, and a display 1050.

A CSI host 1012 included in the application processor 1010 performs serial communication with a CSI device 1041 included in the image sensor 1040 through CSI. For example, an optical serializer may be implemented in the CSI host 1012, and an optical de-serializer may be implemented in the CSI device 1041.

A DSI host 1011 included in the application processor 1010 performs serial communication with a DSI device 1051 included in the display 1050 through DSI. For example, an optical serializer may be implemented in the DSI host 1011, and an optical de-serializer may be implemented in the DSI device 1051.

The electronic system 1000 may also include a radio frequency (RF) chip 1060 which communicates with the application processor 1010. A physical layer (PHY) 1013 of the electronic system 1000 and a PHY of the RF chip 1060 communicate data with each other according to a MIPI DigRF standard. The electronic system 1000 may further include at least one element among a GPS 1020, a storage device 1070, a microphone 1080, a DRAM 1085 and a speaker 1290. The electronic system 1000 may communicate using Wimax 1030, WLAN 1100 or USB 1110, etc.

As described above, according to some embodiments of the inventive concept, problems of row-wise banding noise caused by ground fluctuation and/or sunspots occurring by amplifying an abnormal signal of a pixel in an analog-to-digital conversion circuit of an image sensor can be solved.

In addition, the change in the intensity of current flowing in an amplifier of the analog-to-digital conversion circuit is suppressed or prevented, and therefore, noise caused by the change in the current intensity is reduced or prevented. As a result, the signal quality of the image sensor is increased.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

The invention claimed is:

1. An image sensor, comprising:
a pixel array configured to generate at least one pixel signal;
a ramp generator configured to generate a ramp signal; and
an analog-to-digital converter configured to receive the ramp signal and the pixel signal, and generate a digital signal representing the pixel signal, the analog-to-digital converter including,
at least one comparator, the comparator having an output node configured to output a comparison result signal; and
a restriction circuit electrically connected to the output node, the restriction circuit including a switch and a diode, the switch connected in series to the diode, the restriction circuit configured to suppress a change in total current by creating a current path between the output node and one of a ground and a power supply if the comparison result signal changes, the total current being a current flowing through the comparator plus a current flowing through the restriction circuit.

2. The image sensor of claim 1, wherein the switch is configured to disable the restriction circuit during an initial operation period of the first comparator.

3. The image sensor of claim 1, wherein the at least one comparator is configured to compare the ramp signal and the at least one pixel signal, and to output a comparison result signal.

4. The image sensor of claim 3, wherein the restriction circuit is configured to restrict the comparison result signal.

5. An image sensor, comprising:
a pixel array configured to generate at least one pixel signal;
a ramp generator configured to generate a ramp signal; and
an analog-to-digital converter configured to receive the ramp signal and the pixel signal, and generate a digital signal representing the pixel signal, the analog-to-digital converter including at least one comparing circuit, the comparing circuit including,
a first comparator having a first output node,
a second comparator having input nodes and a second output node, one of the input nodes connected to the first output node of the first comparator, and
a first restriction circuit electrically connected to the second output node, the restriction circuit configured to restrict a voltage at the second output node by creating a current path between the second output node and one of ground and a power supply line if the voltage at the second output node is one of higher or lower than a threshold value.

6. The image sensor of claim 5, wherein the first restriction circuit includes a diode.

7. The image sensor of claim 6, wherein the first restriction circuit includes a switch connected in series to the diode.

8. The image sensor of claim 7, wherein the switch is configured to disable the restriction circuit during an initial operation period of the second comparator.

9. The image sensor of claim 5, wherein
the first comparator includes an amplifier having first and second first stage output nodes, at least one of the first and second first stage output nodes serving as the first output node; and
the comparing circuit includes a second restriction circuit, the second restriction circuit being electrically connected between the first and second first stage output nodes of the amplifier, the second restriction circuit configured to restrict a voltage at the first output node of the first comparator by creating a current path between the first output node and one of ground and a power supply line if the voltage at the first output node is one of higher or lower than a threshold value.

10. The image sensor of claim 5, wherein the first comparator is configured to compare the ramp signal and the at least one pixel signal, and to output a comparison result signal.

11. The image sensor of claim 10, wherein the first restriction circuit is configured to restrict the comparison result signal.

12. An image sensor, comprising:
a pixel array configured to generate at least one pixel signal;
a ramp generator configured to generate a ramp signal; and
an analog-to-digital converter configured to receive the ramp signal and the pixel signal, and generate a digital signal representing the pixel signal, the analog-to-digital converter including,
a first comparator, the first comparator including an amplifier, the amplifier including, a first output node between a first PMOS transistor and a first NMOS transistor connected in series between a power supply voltage and a common node, and a second output node between a second PMOS transistor and a second NMOS transistor connected in series between the power supply voltage and the common node; and a restriction circuit connected between the first and second output nodes, the restriction circuit configured to suppress a change in current flowing through the amplifier when a voltage at the common node falls below a saturation voltage of the first and second NMOS transistors such that a low level of the voltage at the common node is restricted by the pixel signal.

13. The image sensor of claim 12, wherein the restriction circuit includes a diode.

14. The image sensor of claim 13, wherein the diode is a diode connected PMOS transistor.

15. The image sensor of claim 12, wherein the restriction circuit includes a transistor.

16. The image sensor of claim 12, wherein the first comparator is configured to compare the ramp signal and the at least one pixel signal, and to output a comparison result signal.

17. The image sensor of claim 16, wherein the restriction circuit is configured to restrict the comparison result signal.

18. The image sensor of claim 12, wherein the restriction circuit includes a switch.

* * * * *